United States Patent
Salmon et al.

(10) Patent No.: US 11,721,639 B2
(45) Date of Patent: Aug. 8, 2023

(54) MULTI-COMPONENT MODULES (MCMS) INCLUDING CONFIGURABLE ELECTRO-MAGNETIC ISOLATION (EMI) SHIELD STRUCTURES, AND RELATED METHODS

(71) Applicant: QUALCOMM Incorporated, San Diego, CA (US)

(72) Inventors: Jay Scott Salmon, San Diego, CA (US); Anirudh Bhat, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 100 days.

(21) Appl. No.: 17/336,512

(22) Filed: Jun. 2, 2021

(65) Prior Publication Data

US 2021/0407927 A1    Dec. 30, 2021

Related U.S. Application Data

(60) Provisional application No. 63/045,509, filed on Jun. 29, 2020.

(51) Int. Cl.
*H01L 23/552* (2006.01)
*H01L 21/48* (2006.01)
(Continued)

(52) U.S. Cl.
CPC .......... *H01L 23/552* (2013.01); *H01L 21/486* (2013.01); *H01L 21/4857* (2013.01);
(Continued)

(58) Field of Classification Search
CPC . H01L 23/552; H01L 21/4857; H01L 21/486; H01L 21/4871; H01L 21/565;
(Continued)

(56) References Cited

U.S. PATENT DOCUMENTS 6,757,181 B1 * 6/2004 Villanueva .............. H01L 23/60
257/E23.125
8,987,872 B2    3/2015 Hwang et al.
(Continued)

OTHER PUBLICATIONS

Invitation to Pay Additional Fees and Partial International Search for International Patent Application No. PCT/US2021/035625, dated Sep. 15, 2021, 16 pages.
(Continued)

*Primary Examiner* — Selim U Ahmed
*Assistant Examiner* — Evan G Clinton
(74) *Attorney, Agent, or Firm* — Withrow & Terranova, PLLC

(57) ABSTRACT

Multi-component modules (MCMs) including configurable electromagnetic interference (EMI) shield structures, and related methods are disclosed. An EMI shield enclosing an IC or another electrical component in an MCM can protect other components within the MCM from EMI generated by the enclosed component. The EMI shield also protects the enclosed component from the EMI generated by other electrical components. An EMI shield with side-wall structures, in which vertical conductors supported by a wall medium electrically couple a lid of the EMI shield to a ground layer in a substrate, provides configurable EMI protection in an MCM. The EMI shield may also be employed to increase heat dissipation. The side-wall structures of the EMI shield are disposed on one or more sides of an electrical component and are configurable to provide a desired level of EMI isolation.

39 Claims, 25 Drawing Sheets

(51) Int. Cl.
  *H01L 21/56*   (2006.01)
  *H01L 23/14*   (2006.01)
  *H01L 23/367*  (2006.01)
  *H01L 23/498*  (2006.01)
  *H01L 23/66*   (2006.01)
  *H01L 23/00*   (2006.01)
  *H01L 25/065*  (2023.01)

(52) U.S. Cl.
  CPC ........ *H01L 21/4871* (2013.01); *H01L 21/565* (2013.01); *H01L 23/14* (2013.01); *H01L 23/3675* (2013.01); *H01L 23/49816* (2013.01); *H01L 23/49822* (2013.01); *H01L 23/49838* (2013.01); *H01L 23/66* (2013.01); *H01L 24/16* (2013.01); *H01L 25/0655* (2013.01); *H01L 2223/6605* (2013.01); *H01L 2224/16237* (2013.01); *H01L 2924/1632* (2013.01); *H01L 2924/16195* (2013.01); *H01L 2924/16251* (2013.01); *H01L 2924/3025* (2013.01)

(58) Field of Classification Search
  CPC ................ H01L 23/14; H01L 23/3675; H01L 23/49816; H01L 23/49822; H01L 23/49838; H01L 23/66; H01L 24/16; H01L 25/0655; H01L 2223/6605; H01L 2224/16237; H01L 2924/16195; H01L 2924/16251; H01L 2924/1632; H01L 2924/3025; H01L 24/73; H01L 23/3121; H01L 2223/54433; H01L 23/544; H01L 2223/54486; H01L 2224/16225; H01L 2224/73253; H01L 2924/15192; H01L 2924/15311; H01L 2924/15313; H01L 2924/1715; H01L 2924/181; H01L 2924/18161; H01L 2924/19105; H01L 2924/19107; H01L 25/16; H01L 25/18; H01L 25/50

See application file for complete search history.

(56) References Cited

U.S. PATENT DOCUMENTS

| | | | |
|---|---|---|---|
| 2017/0179039 A1 | 6/2017 | Lee et al. | |
| 2018/0130755 A1* | 5/2018 | Lee | ...................... H01L 25/0655 |
| 2018/0261551 A1* | 9/2018 | Lee | .......................... H01L 24/32 |
| 2019/0273312 A1* | 9/2019 | Otsubo | .................... H01Q 1/38 |
| 2019/0311994 A1* | 10/2019 | Hong | ...................... H01L 21/56 |
| 2019/0393162 A1* | 12/2019 | Jun | ...................... H01L 23/3121 |
| 2021/0225779 A1* | 7/2021 | Otsubo | ................... H01L 21/56 |

OTHER PUBLICATIONS

International Search Report and Written Opinion for International Patent Application No. PCT/US2021/035625, dated Nov. 9, 2021, 22 pages.

* cited by examiner

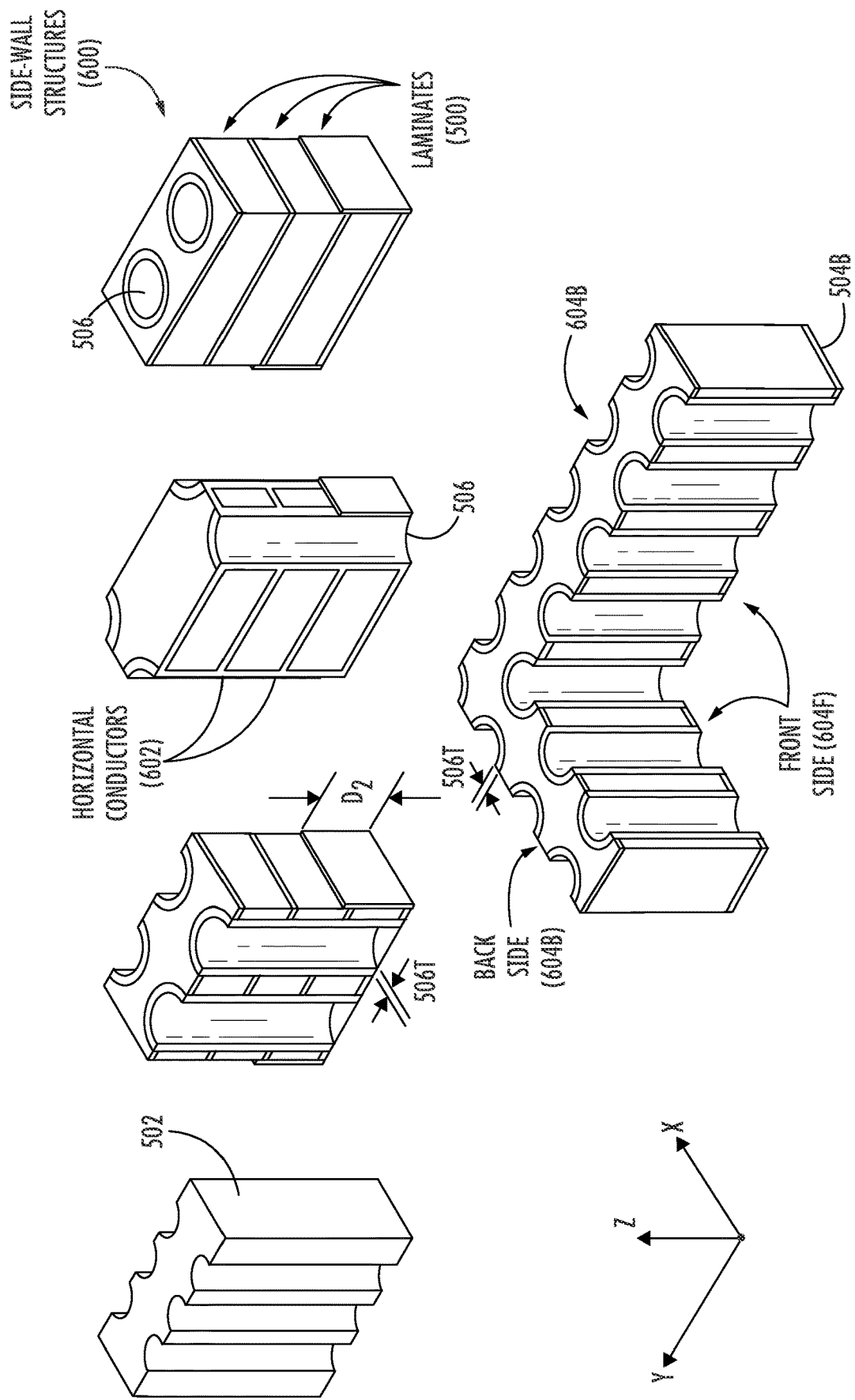

MULTI-COMPONENT MODULES (MCMS) INCLUDING CONFIGURABLE ELECTRO-MAGNETIC ISOLATION (EMI) SHIELD STRUCTURES, AND RELATED METHODS

PRIORITY APPLICATION

The present application claims priority under 35 U,S,C. § 119(e) to U.S. Provisional Patent Application Ser. No. 63/045,509, filed Jun. 29, 2020 and entitled "MULTI-COMPONENT MODULES (MCMs) INCLUDING CONFIGURABLE ELECTRO-MAGNETIC ISOLATION (EMI) SHIELDS IN WHICH SIDE-WALL STRUCTURES INCLUDE VERTICAL CONDUCTORS DISPOSED ON A WALL MEDIUM, AND RELATED METHODS," which is incorporated herein by reference in its entirety.

BACKGROUND

I. Field of the Disclosure

The field of the disclosure generally relates to electronic device packages, and more particularly to packages with electromagnetic isolation shield structures.

II. Background

Consumer electronic devices may include several electrical components, such as integrated circuits (ICs) and other electrical devices mounted on a circuit board or substrate. A multi-component module (MCM) is an IC package in which multiple electrical components and/or surface mount devices (SMDs) are mounted on a substrate that includes electrical wiring to interconnect the components, During operation, some electrical components emit electromagnetic radiation that can interrupt the normal operation of other electrical components nearby. Such electromagnetic radiation, known as electromagnetic interference (EMI), is strongest at the source and exponentially decreases in strength with distance. As a result of EMI, the electronic components in close proximity to an EMI source on an MCM can fail to operate correctly. Examples of electronic devices in which this can be a concern include mobile phones, smart phones, tablets, and other devices that emit radio frequency (RF) transmissions for cellular, WiFi. and/or Bluetooth communication.

Consumer demand for smaller electronic devices forces designers of these devices to mount electrical components in very close proximity to each other on a substrate surface to minimize SMD area, thereby exacerbating the impact of EMI. To address this problem, a conductive shell or a cage of conductors (known as a Faraday shield or EMI shield) can be provided in the IC package that encloses an electrical component(s) to reduce or block electric fields around the electrical component, The EMI shield can also protect the electrical component from environmental external EMI emitted by other components in close proximity and can also protect those other components from EMI emitted by the electrical component within the EMI shield. In this manner, the negative impacts of EMI in MCMs can be reduced or avoided by including an EMI shield around electrical components or devices.

SUMMARY OF THE DISCLOSURE:

Aspects disclosed herein include multi-component modules (MCMs) including configurable electromagnetic interference (EMI) shield structures. Related methods are also disclosed. In exemplary aspects, the integrated circuit (IC) module is an MCM that includes configurable sidewall structures incorporating vertical conductors for connectivity and EMI protection. The IC module includes an EMI shield enclosing an IC or another electrical component in the IC module to protect other components within the IC module from EMI generated by the enclosed component. In exemplary aspects, the EMI shield includes side-wall structures, in which vertical conductors supported by a wall medium electrically couple a lid of the EMI shield to a ground layer in a substrate, provides configurable EMI protection in an MCM. The EMI shield may also be employed to increase heat dissipation. The side-wall structures of the EMI shield are disposed on one or more sides of an electrical component and are configurable to provide a desired level of EMI isolation. Methods of manufacturing MCMs including an EMI shield as discussed above are also disclosed.

In this regard, in one exemplary aspect, an MCM is disclosed. The MCM includes an electrical device mounted on a top surface of a substrate comprising a ground layer. The MCM also includes an EMI shield disposed adjacent to the top surface of the substrate and proximate to the electrical device. The EMI shield includes a shield lid adjacent to a first side of the electrical device. The EMI shield also includes a side-wall structure disposed adjacent to at least a second side of the electrical device. The side-wall structure includes a wall medium. The side-wall structure also includes a vertical conductor disposed at least one of on or inside the wall medium and configured to electrically couple the shield lid to the ground layer of the substrate.

In another exemplary aspect, a method of fabricating an MCM is disclosed. The method includes disposing a shield structure adjacent to a top surface of a substrate and adjacent to an electrical device on the top surface of the substrate, the shield structure including a side-wall structure. The side-wall structure includes a wall medium. The side-wall structure also includes a vertical conductor disposed at least one of on and inside the wall medium. A bottom end portion of the vertical conductor is configured to electrically couple to a ground layer in the substrate. The method also includes disposing a molding compound on the top surface of the substrate. The method also includes disposing a conductive layer on a top surface of the MCM. The conductive layer is electrically coupled to a top end portion of the vertical conductor to form at least a portion of a shield lid of the EMI shield.

BRIEF DESCRIPTION OF THE FIGURES

FIG. 6 is an illustration of configurable side-wall structures that can be formed from the laminate substrate as shown in FIGS. 5A-5C for placement adjacent to SMDs to form an EMI shield in an MCM;

DETAILED DESCRIPTION

Figure 1:
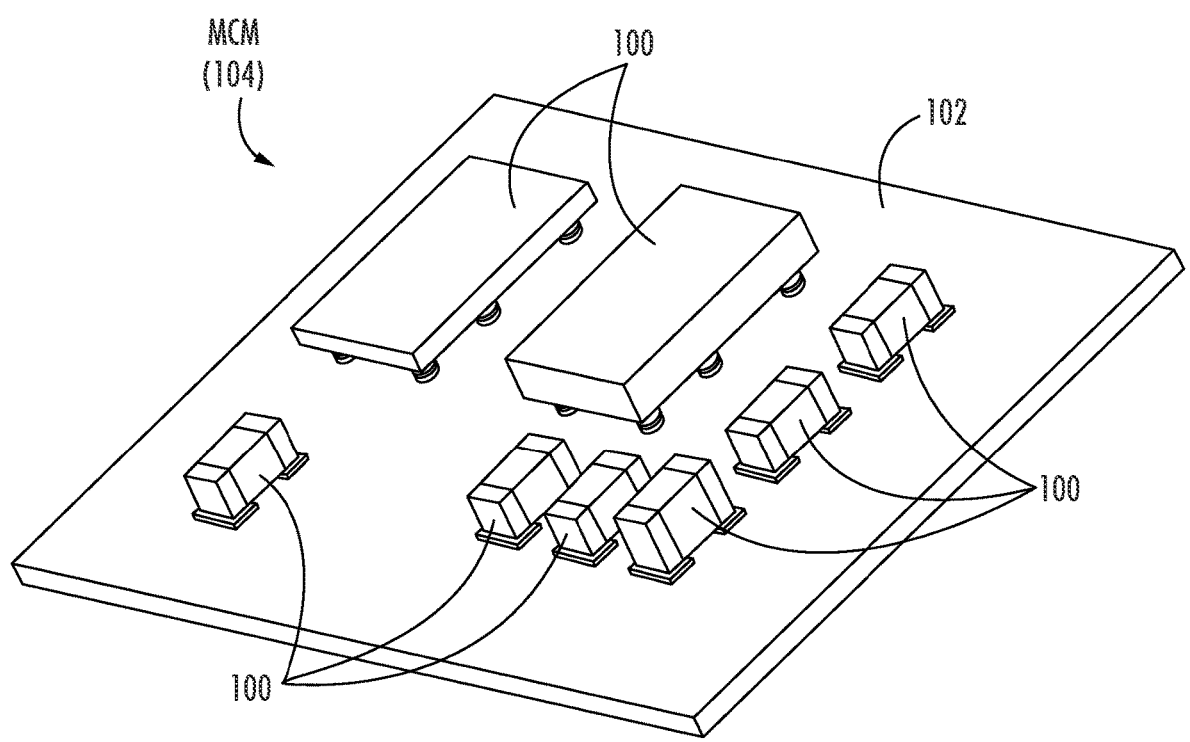
FIG. 1 is an illustration of a perspective view of surface mount devices (SMDs) mounted on a substrate in a multi-component module (MCM)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include multi-component modules (MCMs) including configurable electromagnetic interference (EMI) shield structures. Related methods are also disclosed. In exemplary aspects, the integrated circuit (IC) module is an MCM that includes configurable sidewall structures incorporating vertical conductors for connectivity and EMI protection. The IC module includes an EMI shield enclosing an IC or another electrical component in the IC module to protect other components within the IC module from EMI generated by the enclosed component. In exemplary aspects, EMI shield includes side-wall structures, in which vertical conductors supported by a wall medium electrically couple a lid of the EMI shield to a ground layer in a substrate, provides configurable EMI protection in an MCM. The EMI shield may also be employed to increase heat dissipation. The side-wall structures of the EMI shield are disposed on one or more sides of an electrical component and are configurable to provide a desired level of EMI isolation, Methods of manufacturing MCMs including an EMI shield as discussed above are also disclosed.

An MCM is a form of packaging ICs and components in many consumer electronics devices, such as smart phones, tablets, laptops, etc. An MCM includes various electrical components or devices mounted on the surface of a substrate, Accordingly, the electrical components are generally known as surface mount devices (SMDs), which is a term that may be used herein for any electrical or electronic component or device, passive or active, including ICs, capacitors, inductors, memory chips, etc, that may be mounted on or coupled to a substrate in an MCM. The term "MCM" refers to a package and may be used interchangeably with the term "IC package" herein. In this regard, the terms "MCM" and "IC package" may refer to any package that includes one or more SMDs, any number of which (including zero) may be ICs. FIG. 1 is a perspective view of SMDs 100 mounted on a substrate 102. to illustrate the SMDs 100 in close proximity to each other in an MCM 104.

SMDs may generate electromagnetic radiation during their normal operation. The electromagnetic radiation may be generated at radio frequencies in mobile devices that perform cellular, WiFi, and/or Bluetooth telecommunications, for example. Electromagnetic radiation can be a varying electric field that interferes with the operation of electrical circuits in other SMDs, causing electromagnetic induction, coupling, or conduction, which is referred to as EMI, One device that effectively reduces the EMI emitted by an SMD and also protects an SMD from externally generated EMI is an enclosure known as a Faraday cage or Faraday shield, referred to herein as an EMI shield. The EMI shield is an enclosure formed of conductive material such as conductive metal sheets or wires, such as a box or cage. An externally generated electric field is canceled within the EMI shield because electric charges within the conductors of the EMI shield are distributed to cancel the effects of the electric field inside the EMI shield. EMI cages shield the interior from external electromagnetic radiation if the conductor is sufficiently thick and any holes or gaps between conductors are significantly smaller than the wavelength of the radiation.

Figure 2A:
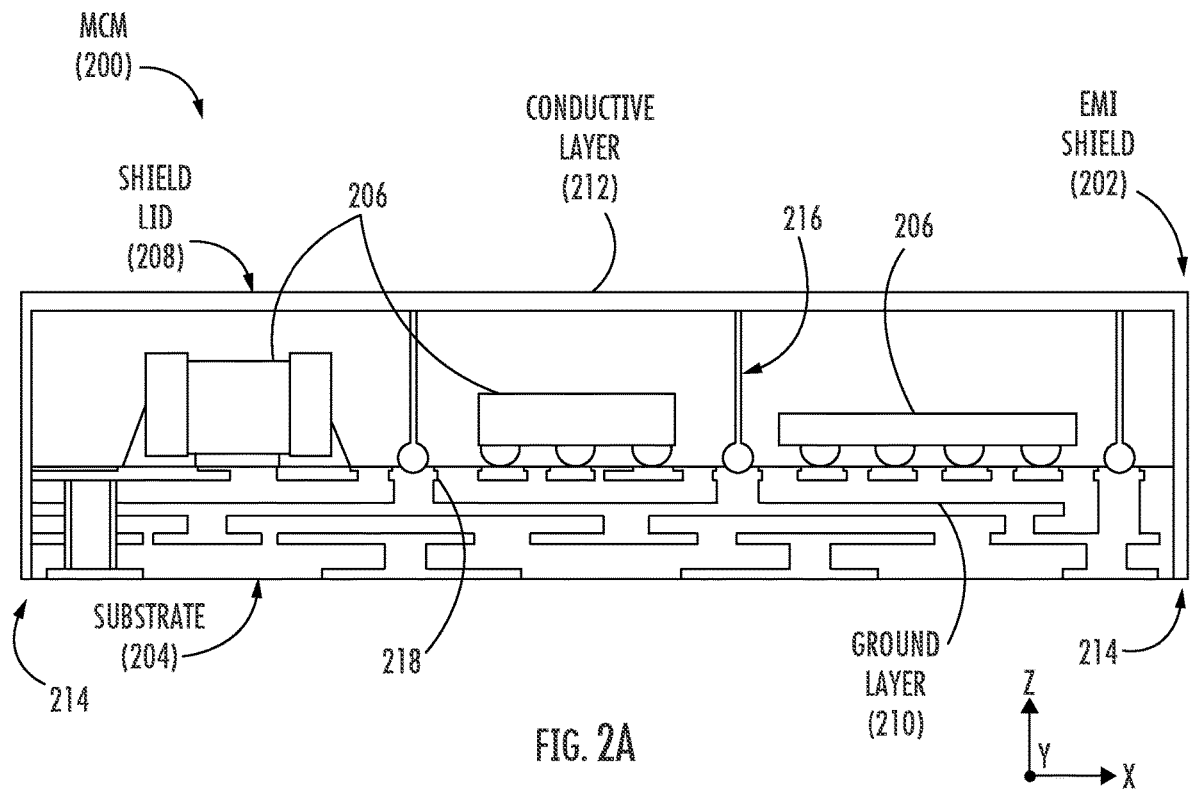
FIG. 2A is a cross-sectional side view of an MCM in which protection against electromagnetic interference (EMI) between respective SMDs is provided by wire bonds vertically coupling an EMI shield lid and a ground layer in the substrate.

An EMI shield may be included in the fabrication of an MCM to provide protection from EMI among SMDs in close proximity to each other. A cross-sectional side view of one example of an MCM 200 including an EMI shield 202 is illustrated in FIG. 2A. The MCM 200 includes a multi-layer or laminate substrate 204 on which SMDs 206 are mounted. A shield lid 208 above the SMDs 206 and a ground layer 210 below the SMDs 206 in the substrate 204 form a top and bottom of the EMI shield 202 enclosure. The relative and directional terms "top," "bottom," "up," "down," "above," and "below," for example, as used to describe the illustration in FIG. 2A and other figures herein, may be based on an orientation of the illustration and are not intended to be limiting unless otherwise stated. It is recognized that the meanings of relative terms may change among different orientations.

The shield lid 208 is a conductive layer 212 extending across the substrate 204 and down the external side surfaces 214 of the MCM 200, The shield lid 208 couples to the ground layer 210 to form an enclosure around the entire MCM 200. Vertical conductors are provided by wire bonds 216 to create internal cages within the MCM 200 during MCM fabrication according to known methods. The wire bonds 216 connect to a gold-plated contact 218 on the substrate 204, which increases a cost of the MCM 200 as a number of the wire bonds 216 increases. "Keep out" zones around the gold-plated contacts 218 impose minimum distance restrictions between the gold-plated zones and other contacts. There are also minimum spacing requirements between the wire bonds 216 and the SMDs 206 of the MCM 200. As a result of these limitations and the relatively thin diameter of the wires, wire bonds 216 provide limited EMI protection within the MCM 200 at a high fabrication cost.

Figure 2B:
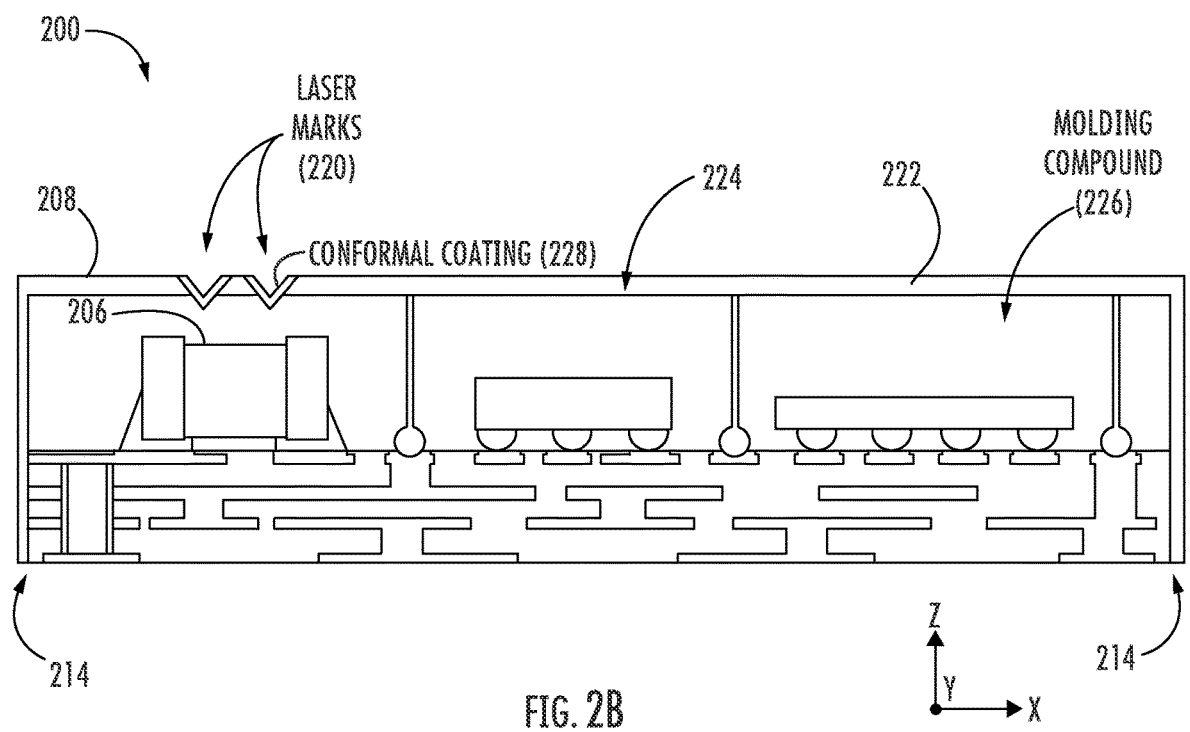
FIG. 2B is a cross-sectional side view of the MCM in FIG. 2A in which laser engraving penetrates through the EMI shield lid and into a molding compound.

FIG. 2B is the MCM 200 in FIG. 2A with the addition of laser marks 220 in the shield lid 208 for identification of the MCM 200. In FIGS. 2A and 2B, the shield lid 208 is formed by sputtering a metal 222 onto a planarized top surface 224 of a molding compound 226 and also onto the side surfaces 214. The laser marks 220 cut into the molding compound 226 by a laser (not shown) can easily penetrate through the metal 222 and into the molding compound 226. As a result, a conformal coating 228 deposited into the cut laser marks 220 may extend below the top surface 224, which can induce a capacitive coupling to the SMD 206 beneath the laser marks 220.

Figure 3A:
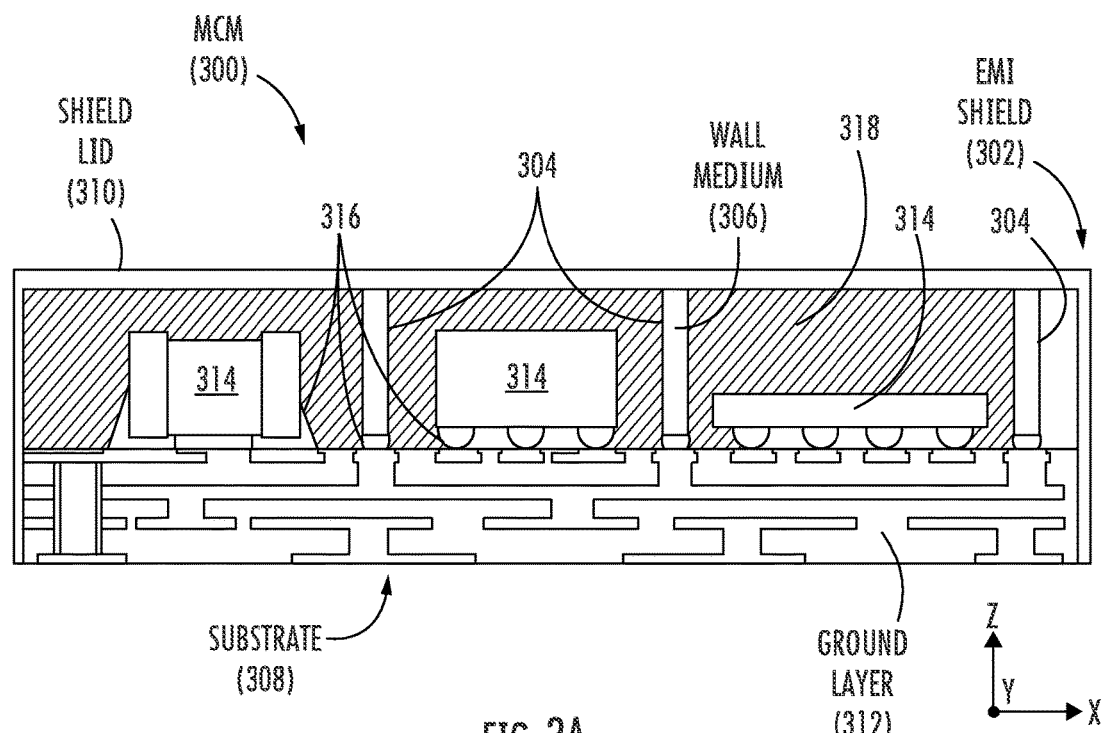
FIG. 3A is a cross-sectional side view of an exemplary MCM including an EMI shield with configurable side-wall structures in which vertical conductors are disposed at least one of on and inside a wall medium that is mounted on a substrate surface to electrically couple an EMI shield lid to a ground layer.

FIG. 3A is a cross-sectional side view of an exemplary MCM 300 including an EMI shield 302 including side-wall structures 304 in which vertical conductors (not shown) are disposed on a wall medium 306 mounted on a substrate 308. The vertical conductors electrically couple a shield lid 310 of the EMI shield 302 to a ground layer 312 in the substrate 308. The EMI shield 302 is disposed adjacent to the substrate 308 and proximate to the SMDs 314. Thus, the shield lid 310, the ground layer 312, and the vertical conductors in the side-wall structures 304 form an enclosure (i.e., Faraday cage) to provide EMI protection for SMDs 314. The side-wall structures 304 are not connected to the ground layer 312 by a gold-plated contact, which keeps fabrication cost of the MCM 300 lower compared to the MCM 200 using wire bonds 216 in FIG. 2A. The side-wall structures 304 may be placed (e.g., by a pick-and-place tool) on a solder or conductive paste 316 in a manner that may be similar to connecting the SMDs 314 to the substrate 308, In this regard, the side-wall structures 304 do not require the use of a wire-bond tool and are not subject to the minimum distance restrictions imposed on the wire bonds 216 in FIG. 2A. The locations of the side-wall structures 304 may be limited only by the accuracy of component placement methods. After a molding compound 318 is disposed on a surface of the substrate 308, the molding compound 318 and the side-wall structures 304 are planarized (e.g., parallel to the surface of the substrate) before the shield lid 310 is formed.

Figure 3B:
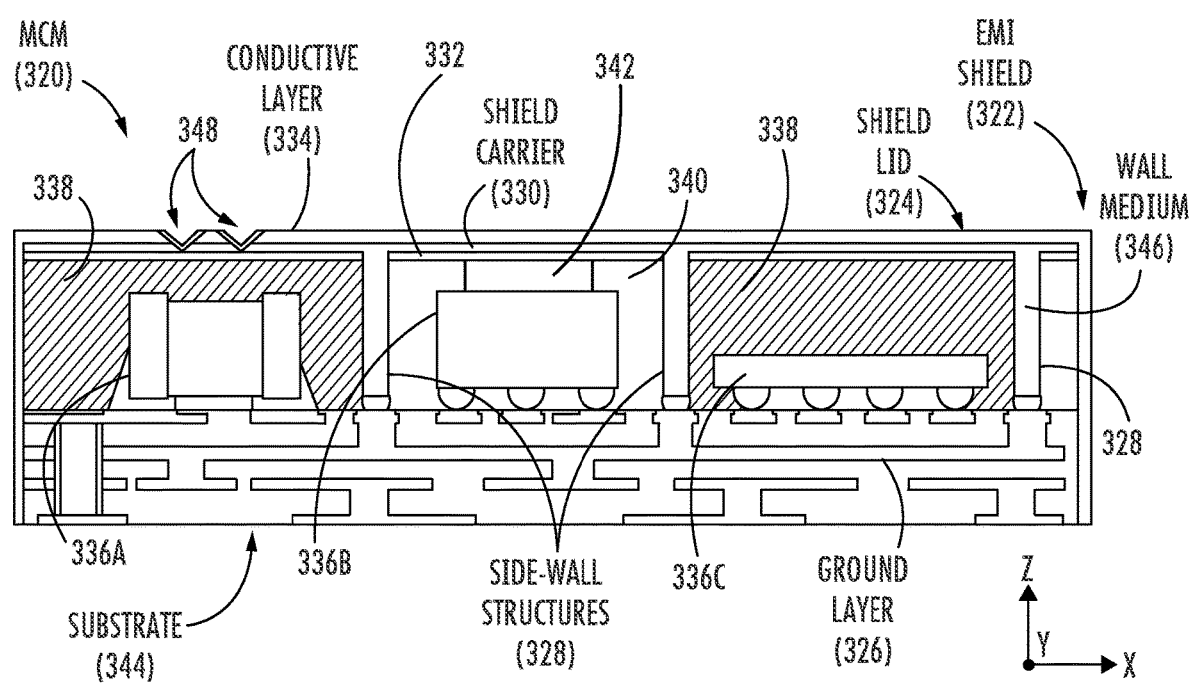
FIG. 3B is a cross-sectional view of another exemplary MCM including laser engraving in a shield lid of the EMI shield to a depth of a laser stop layer.

FIG. 3B is a cross-sectional side view of an MCM 320 including an EMI shield 322 formed of a shield lid 324, a ground layer 326, and side-wall structures 328. In this example, the side-wall structure 328 extends down from a shield carrier 330 that includes a laser stop layer 332. The shield lid 324 is formed of the laser stop layer 332, the shield carrier 330, and a conductive layer 334 formed over the MCM 320. The MCM 320 includes SMDs 336A, 336B, and 336C individually enclosed by the EMI shield 322. The shield lid 324 is adjacent (e.g., in the Z-axis direction) to a first side of the SMDs 336A-336C. In the MCM 320, although a molding compound 338 is disposed on the SMDs 336A and 336C, the SMD 336B benefits from an air space 340 and a thermal paste 342 thermally coupling the SMD 336B to the shield lid 324. The thermal paste 342 could be replaced by a solid thermal conductor or other thermally conductive material other than air and a molding compound 338. In this context, material(s) referred to herein as "other than air" may be gases other than natural atmosphere, liquids, or solids used for purposes of thermal conduction. Such materials may also be used for electrical or magnetic isolation, adhesion, etc.

Due to the need for the air space 340, the shield lid 324 cannot be disposed on a planarized surface of the molding compound 338. Instead, the side-wall structures 328 are formed from a wall medium 346 coupled to the shield carrier 330. As explained below, after the SMDs 336A-336C are placed on a substrate 344, and the thermal paste 342 is disposed on the SMD 336B, the EMI shield 322, including the shield carrier 330, the laser stop layer 332, and the side-wall structures 328 are transferred together as a single structure and placed on the substrate 344 such that the wall structures 328 are disposed around the SMD 336B. In some examples, the wall structures 328 are disposed adjacent to at least a second side of the SMDs 336A-336C. The molding compound 338 is disposed on the SMDs 336A and 336C by any known means including compression molding or transfer molding and allowed to enter the EMI shield 322 by one or both of openings in the shield carrier 330 and openings in the side-wall structures 328. However, the side-wall structures 328 along a perimeter around and adjacent to sides of the SMD 336B are continuous panels without any openings that would allow the molding compound 338 to enter the air space 340. In this manner, the side-wall structures 328 are configurable to allow or prevent entry of molding compound into an EMI enclosure formed by the EMI shield 322.

The MCM 320 also includes laser marks 348, which are cut into the conductive layer 334 and the shield carrier 330. However, the laser stop layer 332 has a much slower rate of laser penetration than either the conductive layer 334 or the shield carrier 330, which improves control of the depth of the laser marks 348 and prevents the laser marks 348 from penetrating closer to the SMD 336A and possibly creating unwanted capacitive coupling as may occur in the MCM 200 in FIG. 2B.

Figure 4A:
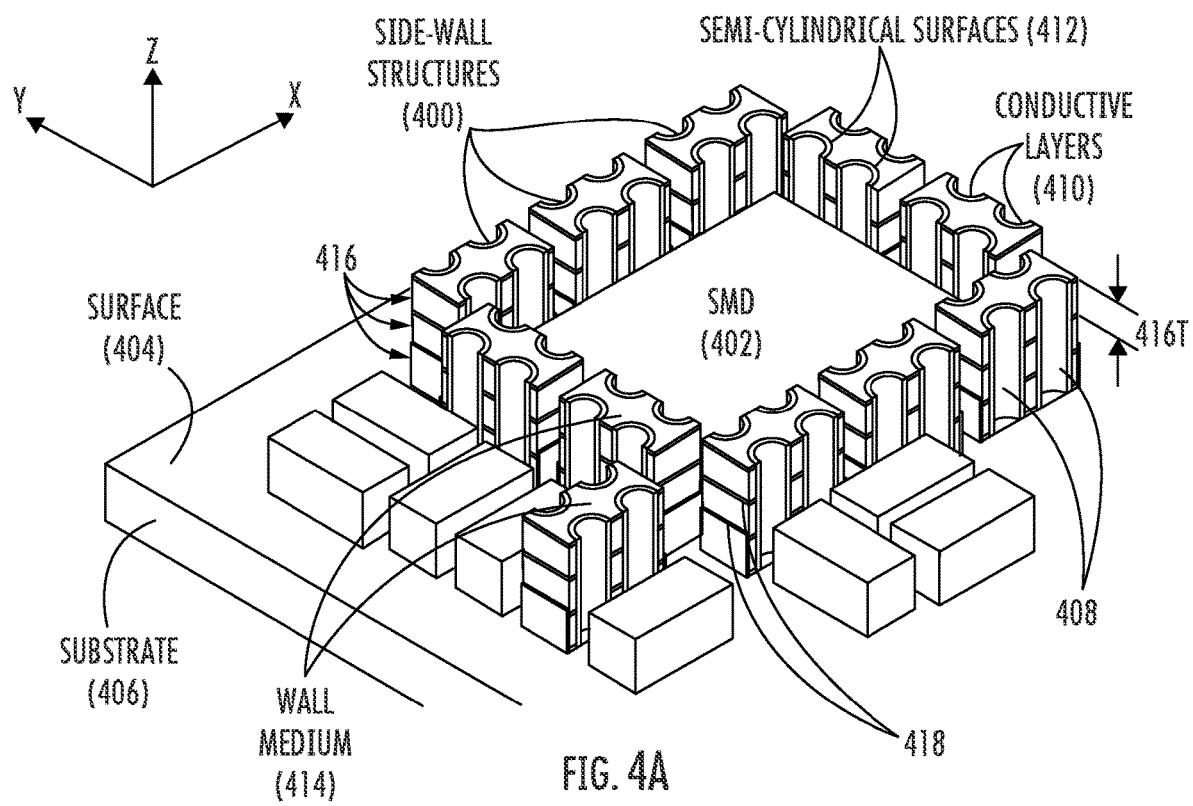
FIG. 4A is a perspective view of configurable side-wall structures of an EMI shield placed adjacent to an electrical component on a surface of a substrate.

The side-wall structures 304 as shown in FIG. 3A may also be referred to herein as shield structures 304 because they are structures forming part of the EMI shield 302. The side-wall structures 304 are described in more detail with regard to FIG. 4A. FIG. 4A is a perspective view of configurable side-wall structures 400 corresponding to the side-wall structures 304 in FIG. 3A. The side-wall structures 400 may be employed to form the vertical conductors of an EMI shield electrically coupling a shield lid (not shown) and a ground layer (not shown) to enclose an SMD 402. FIG. 4A shows an example in which the side-wall structures 400 are placed around the SMD 402 on a surface 404 of a substrate 406. The surface 404 may also be referred to herein as a top surface 404 because it is a primary surface of the substrate 406 on which SMDs 402 are mounted. However, though not shown here, SMDs 402 may also be mounted on at least one other surface of the substrate 406. The side-wall structures 400 may be placed by, for example, a pick-and-place tool that may be the same tool used to place the SMD 402 on the substrate 406. A placement and a shape of the side-wall structures 400 are not limited to the configuration shown in FIG. 4A. The side-wall structures 400 include vertical conductors 408 shown here as conductive layers 410 on semi-cylindrical surfaces 412 of a wall medium 414. The vertically oriented semi-cylindrical shapes of the side-wall structures 400 illustrated in FIG. 4A are explained further below with reference to FIG. 5. The side-wall structures 400 in FIG. 4A also include multiple layers 416 of the wall medium 414 separated by horizontal conductors 418. A thickness 416T of the layers 416 determines a vertical distance between the horizontal conductors 418. The frequencies of EMI blocked by an EMI shield depend on distances between conductive elements. Thus, the frequency range of EMI protection provided by an EMI shield formed with the side-wall structures 400 can be frequency-adjusted based on placements of the side-wall structures 400 relative to each other, physical characteristics and locations of the vertical conductors 408 formed on the side-wall structures 400, and the thicknesses of the layers 416 (e.g., the distance between horizontal conductors 418).

Figure 4B:
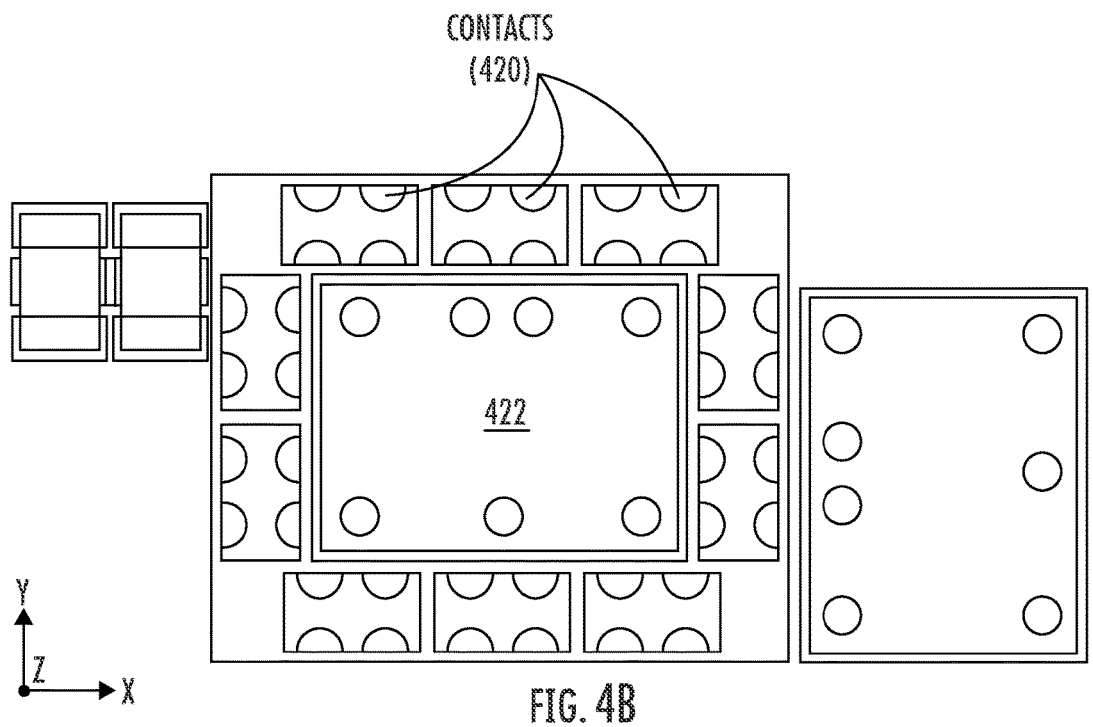
FIG. 4B is a top view of a substrate showing an example of contacts for electrically coupling the configurable side-wall structures in FIG. 4A to a ground layer in the substrate.

FIG. 4B is a top view of the substrate 406 on which contacts 420 have been formed around a location 422 of the SMD 402. The contacts 420 shown in FIG. 4B are semi-circular to correspond to the semi-cylindrical shapes of the side-wall structures 400 in FIG. 4A. The contacts 420 are provided to electrically couple the vertical conductors 408 to the substrate 406. Though the contacts 420 in FIG. 4B are shaped to correspond to the shapes of the side-wall structures 400, the contacts 420 are not limited in this regard and may be any shape capable of adequately electrically coupling the vertical conductors 408 to the substrate 406.

Figure 5A:
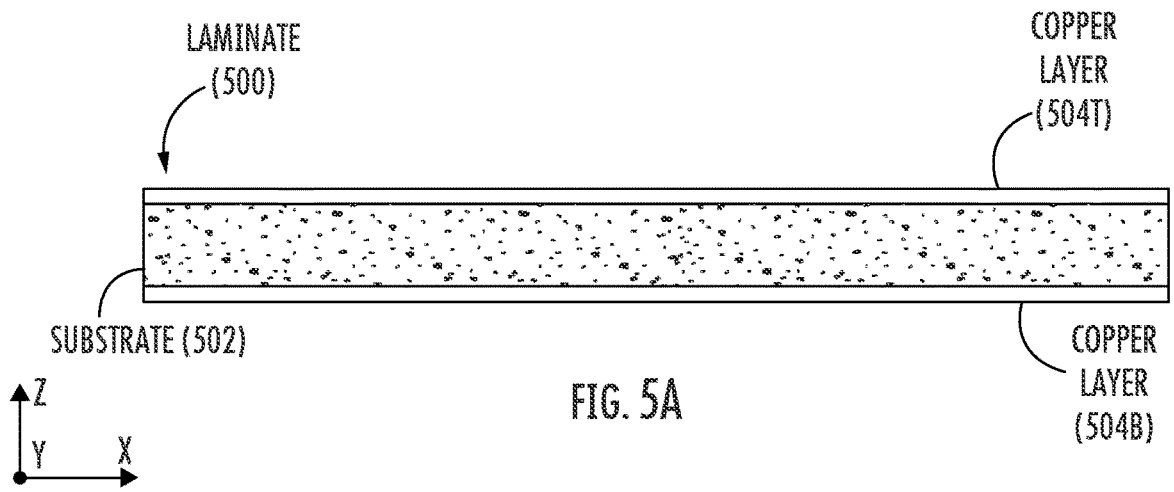
FIGS. 5A-5C illustrate stages of forming side-wall structures in an example of the EMI shield shown in FIG. 4A from a laminate substrate.

FIG. 5A illustrates one example of a stage of fabricating the side-wall structures 400 in FIG. 4A from a laminate 500. The laminate 500 includes a substrate 502 of insulating material (e.g., FR4 material) commonly used in printed circuit boards (PCBs) laminated with copper layers 504T and 504B on the top and bottom surfaces of the substrate 502, respectively. The substrate 502 corresponds to the wall medium 306 in FIG. 3A and the wall medium 346 in FIG. 3B. FIG. 5A is a side view in a Y-axis direction showing a cross-section in an X-axis direction and a Z-axis direction.

Figure 5B:
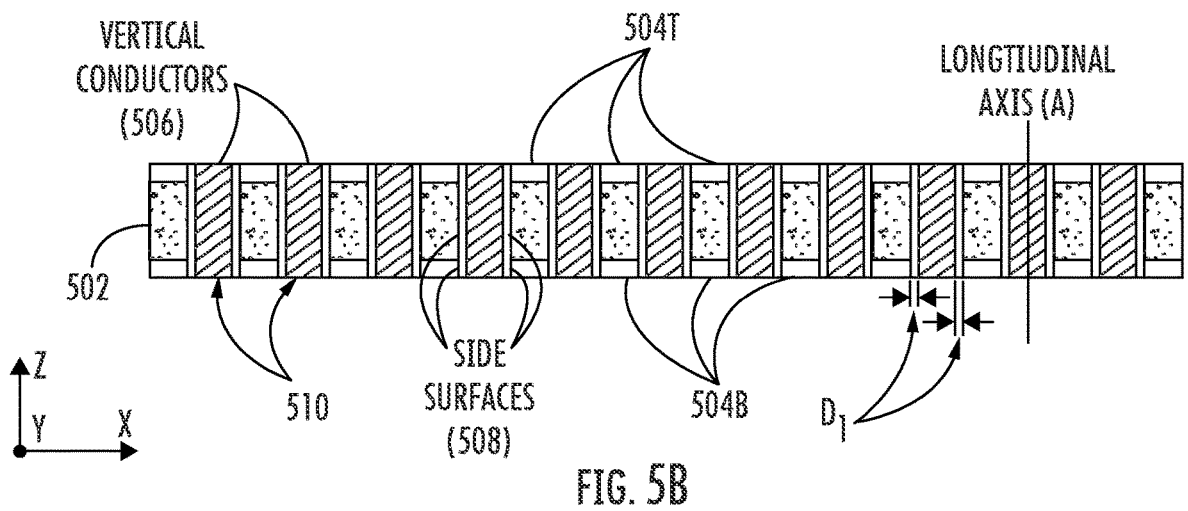

In FIG. 5B, vertical conductors 506 are formed on side surfaces 508 of holes 510 formed through the substrate 502 and the copper layers 504T and 504B. The holes 510 have a longitudinal axis A extending in the Z-axis direction of the substrate 502. The holes 510 may be formed by drilling, boring, punching, etc. or any other means known in the art. The holes 510 could also be formed by different means such that the holes 510 are not round and the vertical conductors 506 formed therein are not cylindrical. The present disclosure is not limited to cylindrical or semi-cylindrical vertical conductors. The vertical conductors 506 may be formed on the side surfaces 508 in the wall structure by vapor deposition or other means known in the art to form a hollow cylindrical vertical conductor 506 having a thickness 506T. The holes 510 may also be filled with a conductive material (not shown) to form solid cylindrical vertical conductors 506. The vertical conductors 506 are electrically coupled to the copper layers 504T and 504B.

Figure 5C:
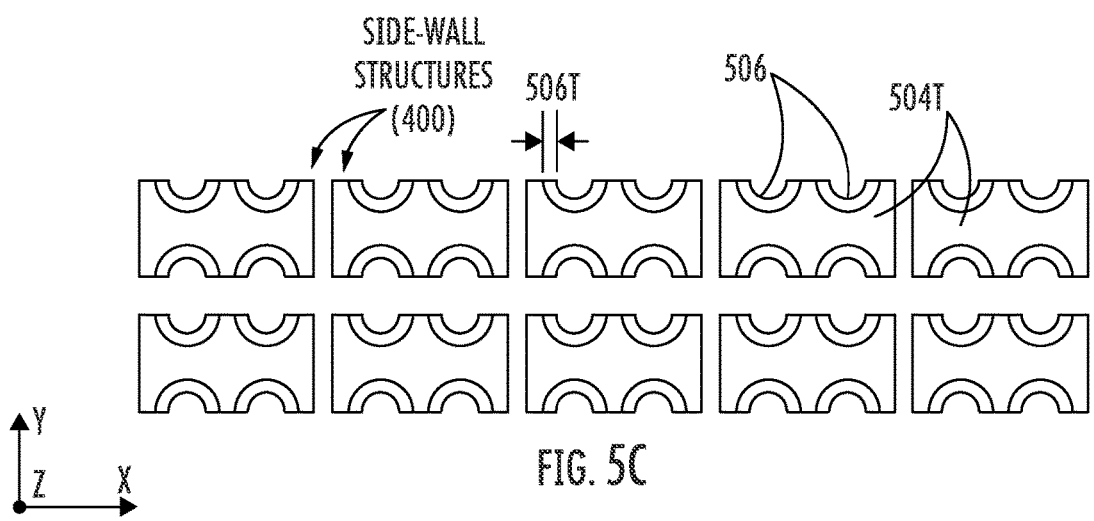

FIG. 5C is a top view of the side-wall structures 400 that have been singulated from the laminate 500 and shows the shapes of the individual side-wall structures 400 in the X-axis direction and the Y-axis direction. The top view in FIG. 5C shows the copper layer 504T is disposed on top of the substrate 502 and also shows an end view of an end portion of the vertical conductors 506 having the thickness 506T. In the example in FIG. 5C, the laminate 500 is cut in the X-axis direction through the centers of the holes 510, but the side-wall structures are not limited in this regard, as shown in FIG. 6, FIG. 6 is an illustration of perspective views of examples of side-wall structures 600 that can be formed from the laminate 500 in FIG. 5A. The side-wall structures 600 may have various configurations different than the side-wall structures 400 in FIGS. 4A and 5C. The configurability of the side-wall structures 600 provides greater configurability in the EMI protection provided by the EMI shields 302 and 322 in FIGS. 3A and 3B. Characteristics such as the thickness 506T of the vertical conductors 506 and horizontal conductors 602, separation of the vertical conductors 506 in the X-axis direction and/or the Y-axis direction, and separation of the horizontal conductors 602 in the Z-axis direction may all be individually adjusted as needed. In addition, the side-wall structures 600 can provide vertical conductors 506 on a front side 604F and a back side 604B in any relative alignment for increased EMI protection. As shown, the side-wall structures 600 can be formed from the laminate 500 in FIG. 5A by shaping in the X-axis direction and the Y-axis direction. In addition, the side-wall structures 600 may include multiple laminates 500 that are stacked vertically to provide a side-wall structure 600 having greater height and/or for the purpose of including horizontal conductors having a preferred distance D) between them for EMI protection corresponding to a frequency range, The vertical conductors 506 extend in the Z-axis direction such that an end portion of the vertical conductors 506 electrically couple to the copper layer 504B on the bottom of the side-wall structures 600 which may couple to a ground layer in a substrate (not shown). The vertical conductors also extend to a top surface of the side-wall structures 600 such that a second end portion of the vertical conductors 506 are electrically coupled to a shield lid (not shown). It is to be understood that the side-wall structures 600 in FIG. 6 are non-limiting examples.

Figure 7:
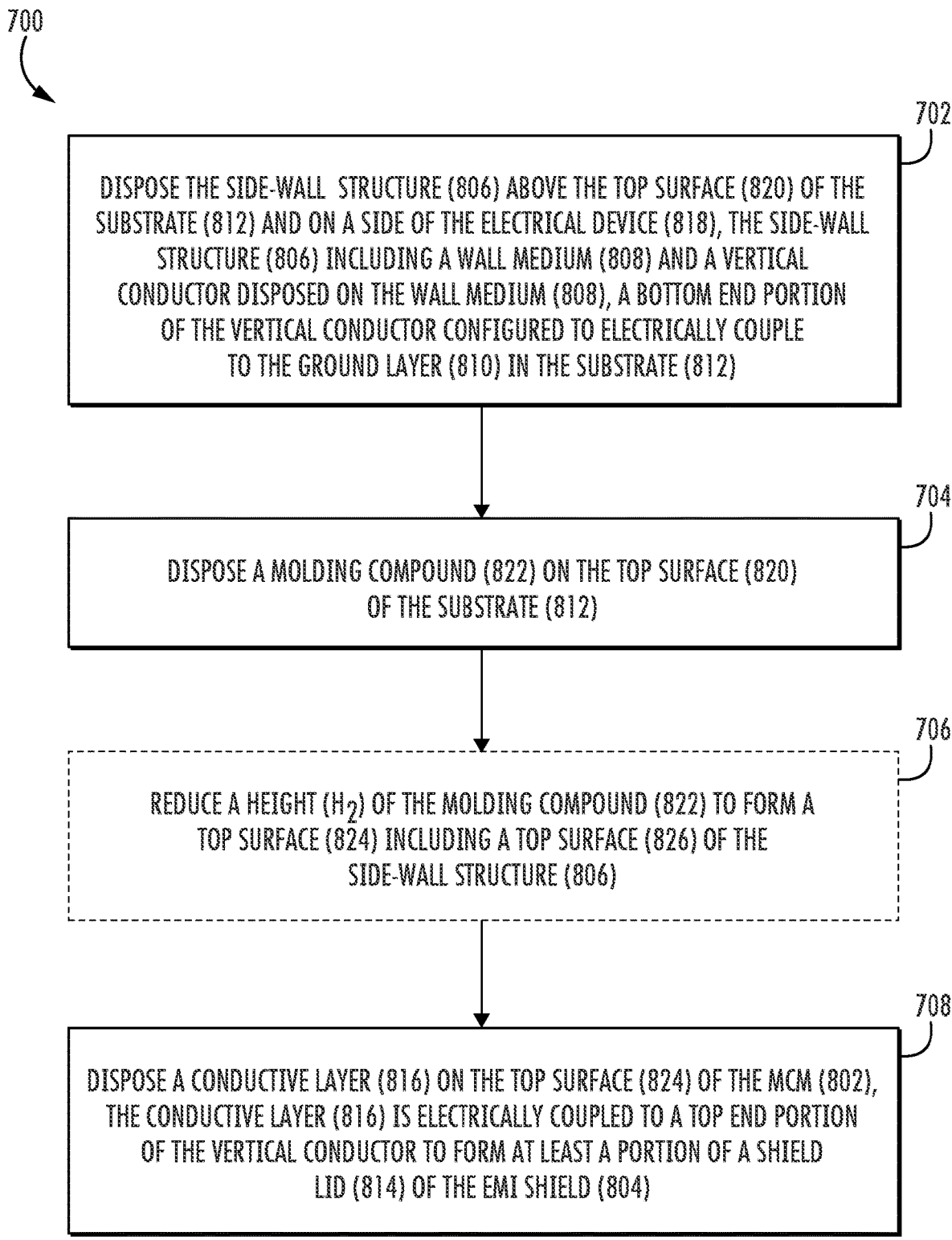
FIG. 7 is a flowchart illustrating an exemplary method of fabricating MCMs including an EMI shield in a first example including side-wall structures as shown in FIGS. 4A, 4B, 5A-5C, and 6.
Figure 8A:
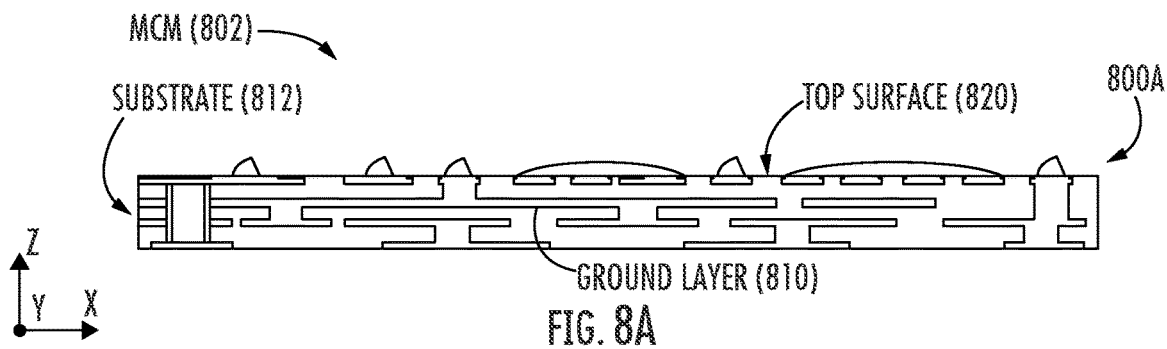
FIGS. 8A-8E are cross-sectional side views of an MCM including an EMI shield in stages of fabrication in the method illustrated in FIG. 7.
Figure 8B:
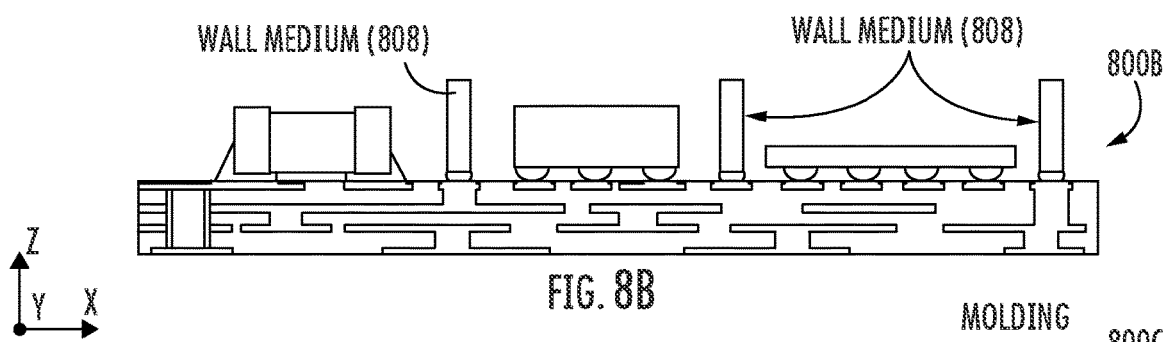
Figure 8C:
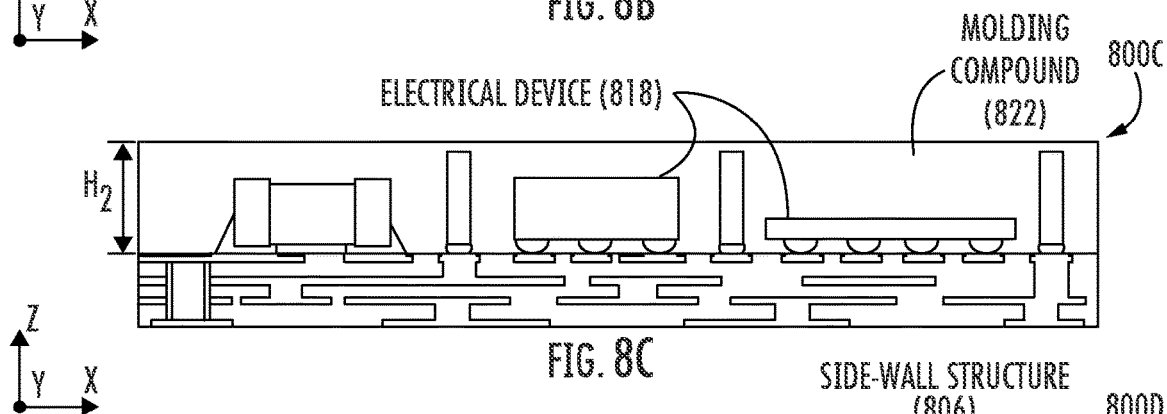
Figure 8D:
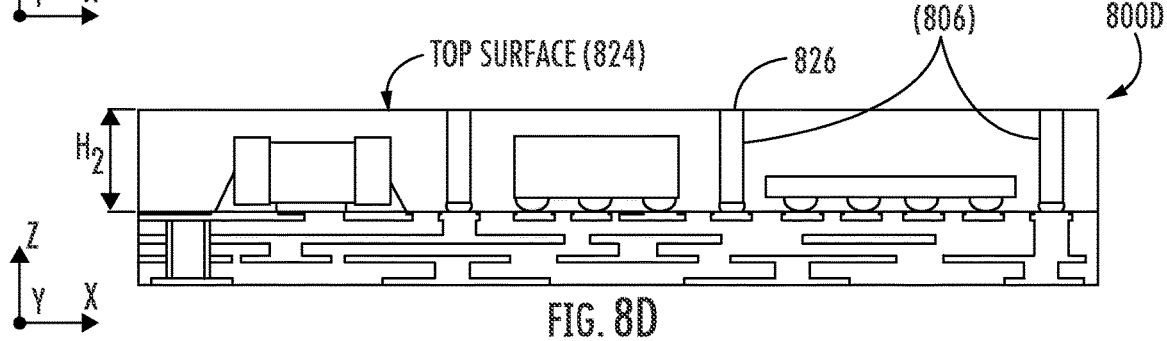
Figure 8E:
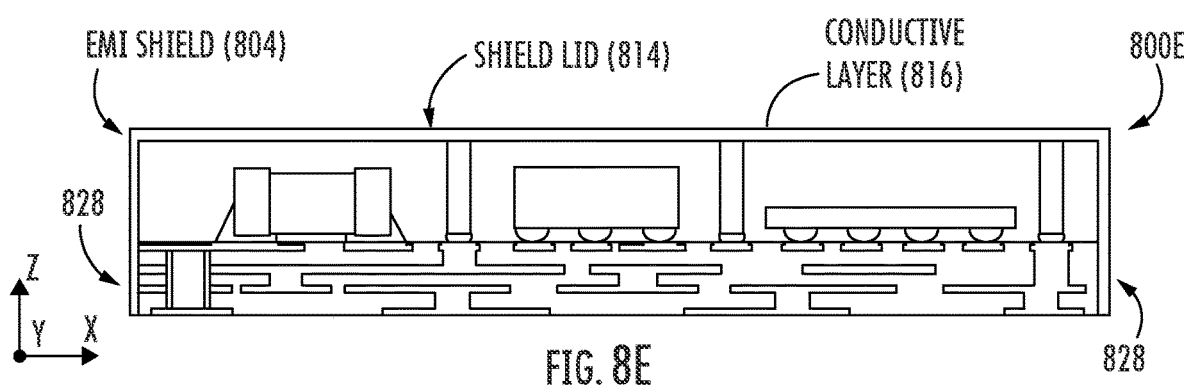

FIG. 7 is a flowchart illustrating a method 700 of fabricating an MCM 802. The method 700 is described with reference to the fabrication stages 800A-800E illustrated in FIGS. 8A-8E. The MCM 802 includes an EMI shield 804 including side-wall structures 806 including configurable vertical conductors (not shown) disposed on wall mediums 808 to electrically couple a ground layer 810 in a substrate 812 and a shield lid 814, which includes a conductive layer 816. Fabrication stage 800A in FIG. 8A illustrates the substrate 812. including the ground layer 810. In the fabrication stage 800B in FIG. 8B, electrical device 818 is mounted on a top surface 820 of the substrate 812 including the ground layer 810. The top surface 820 is referred to as the top surface in MCM 802 because of the illustrated orientation of the substrate 812 but also because the electrical devices (SMDs) 818 are primarily mounted on the top surface 820. In other words, the majority of SMDs 818 in the MCM 802 are mounted on the top surface 820. The electrical device 818 and other electrical devices 818 (or SMDs 818) are also mounted on the top surface 820 of the substrate 812 in fabrication stage 800B. The fabrication stage 800B also includes forming the side-wall structure 806 (shield structure 806) of the EMI shield 804. As shown in the fabrication stage 800B in FIG. 8B, the method 700 includes disposing the side-wall structure 806 above the top surface 820 of the substrate 812. and on a side of the electrical device 818, the side-wall structure 806 including a wall medium 808 and a vertical conductor disposed on the wall medium 808, a bottom end portion of the vertical conductor configured to electrically couple to the ground layer 810 in the substrate 812 (block 702). The fabrication stage 800B in FIG. 8B also shows the side-wall structures 806 that have been formed and disposed above the top surface 820 of the substrate 812. The method 700 further includes disposing a molding compound 822 on the top surface 820 of the substrate 812 (block 704). Fabrication stage 800C in FIG. 8C illustrates the molding compound 822 disposed on the top surface 820 of the substrate 812 to a height $H_2$ that, for example, may be greater than a height of the side-wall structure 806. The method 700 includes an optional step of reducing the height $H_2$ of the molding compound 822 to form a top surface 824 including a top surface 826 of the side-wall structure 806 (block 706). Fabrication stage 800D in FIG. 8D illustrates the reduced height $H_2$ of the molding compound 822 forming the top surface 824 including the top surface 826 of the side-wall structure 806. The method 700 further includes disposing the conductive layer 816 on the top surface 824 of the MCM 802. The conductive layer 816 is electrically coupled to a top end portion (not shown) of the vertical conductor to form at least a portion of the shield lid 814 of the EMI shield 804 (block 708). Fabrication stage 800E in FIG. 8E illustrates the shield lid 814 formed by the conductive layer 816 disposed over the top surface 824 including the molding compound 822 and the top surface 826 of the side-wall structure 806. Fabrication stage 800E also illustrates that the conductive layer 816 is disposed on sides 828 of the MCM 802. In other words, the EMI shield 804 is disposed adjacent to the top surface 820 of the substrate 812 and proximate to the electrical devices 818. The shield lid 814 is adjacent to (e.g., in the Z-axis direction) a first side (e.g., a top side) of the electrical devices 818 and parallel to the top surface 820 of the substrate 812. The side-wall structure 806 is disposed adjacent to (e.g., in at least one of the X-axis direction and the Y-axis direction) at least a second side of the electrical devices 818 and extends in a direction orthogonal to (e.g., in the Z-axis direction) the top surface 820 of the substrate 812 between the top surface 820 and the shield lid 814.

FIGS. 9A-9F illustrate various views 900A-900F of a second example of shield structures 901 in which one or more side-wall structure 902 are coupled to a shield carrier 904. The side-wall structures 902 are formed with relative positioning on the shield carrier 904 that is appropriate to coincide with SMDs 922 mounted on a substrate 920 in FIG. 9G, and can be disposed in a single action onto the surface of the substrate 920 by placement of the shield structure 901. In this manner, a number of steps of fabricating an EMI shield on an MCM are reduced. View 900A is a perspective view from a top side 906 of the shield carrier 904 including windows 908A and 908B in an example in which taller SMDs (not shown) may extend through the shield carrier 904. The shield carrier 904 also includes openings 910 to allow a molding compound to be disposed on an SMD beneath the shield carrier 904. The openings 910 may be sized to avoid transmission of electromagnetic radiation in a frequency range. The shield carrier 904 in view 900A may be a thin conductive (e.g., metal) plate or layer. The shield carrier 904 together with one or more of the side-wall structures 902 coupled to the bottom side thereof form a shield structure 901. Thus, disposing the shield structure 901 includes disposing the side-wall structure 902 coupled to the shield carrier 904.

Figure 9A:
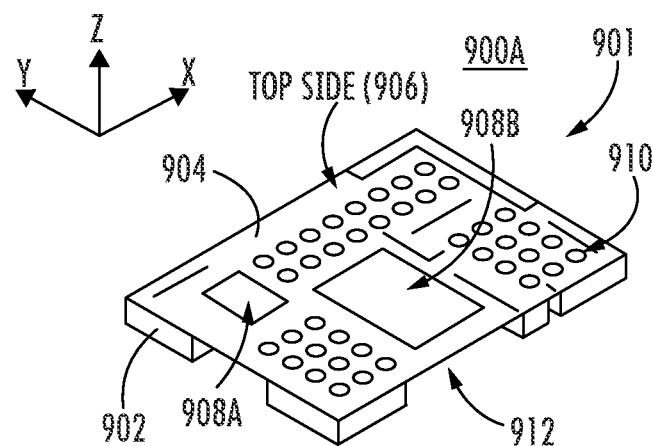
FIGS. 9A-9F illustrate various views of shield structures of EMI shields according to a second example in which side-wall structures are coupled to a shield carder that may be a shield lid and FIG. 9G illustrates a package substrate prepared to have the EMI shields in FIGS. 9A-9F mounted thereon.
Figure 9B:
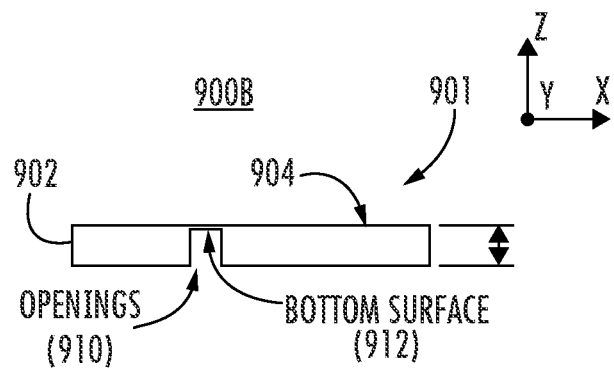
Figure 9C:
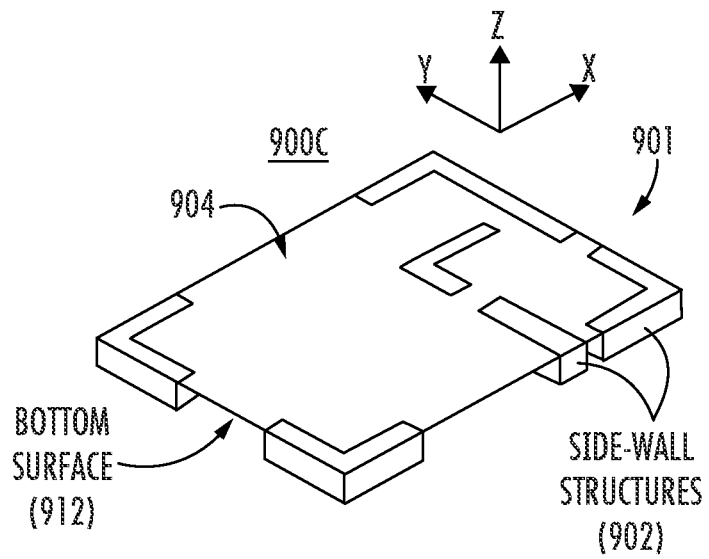

In FIG. 9B. view 900B of the shield structure 901 is a side view showing the side-wall structure 902. coupled to a bottom surface 912 of a thin plate or layer serving as the shield carrier 904, The side-wall structure 902 includes an opening 910 through which molding compound may be disposed around an SMD in a transfer molding process. View 900C in FIG. 9C is a perspective view of a shield carrier 904 that does not include openings 910 or windows 908A and 908B. The shield carrier 904 in FIG. 9C is transparent to more clearly show the side-wall structures 902 coupled or attached to the bottom surface 912. Details of attaching of the side-wall structures 902 to the shield carrier 904 are provided with reference to FIG. 10.

Figure 9D:
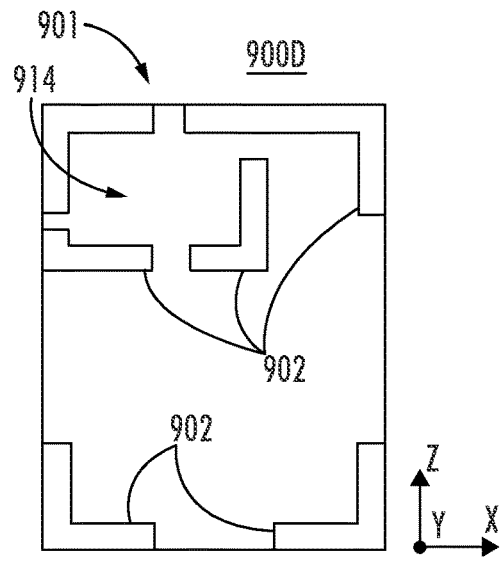
Figure 9E:
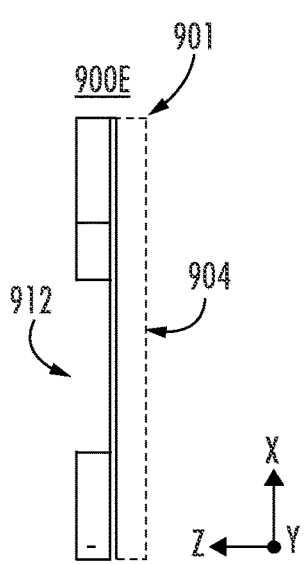
Figure 9F:
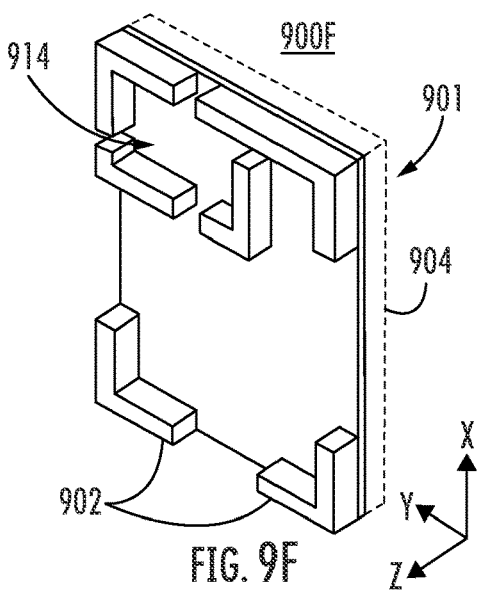
Figure 9G:
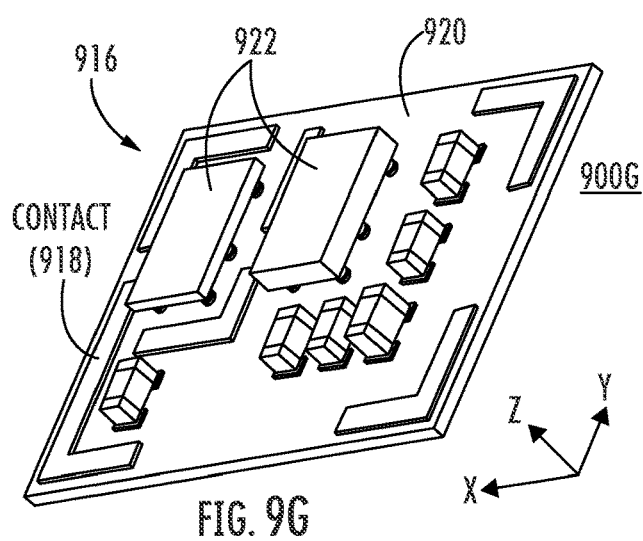

View 900D in FIG. 9D is a bottom view of the bottom surface 912 of the shield carrier 904 and the bottom surfaces of a plurality of the side-wall structures 902 coupled to the bottom surface 912 of the shield carrier 904. The plurality of side-wall structures are positioned to form enclosures 914 around SMDs (electrical devices) on a substrate 920 (FIG. 9G). View 900E in FIG. 9E is a side view of the shield structure 901 in view 900E. View 900E also illustrates an optional thicker shield carrier 904 that may be formed of a thicker conductive layer, an insulating material, or a laminate of conducting and non-conducting layers. A thicker shield carrier 904 may be used for increased structural rigidity over a thinner plate, for example. View 900F in FIG. 9F is a perspective view of the bottom surface 912 of the thicker shield carrier 904 in view 900E showing the enclosure 914 formed by the plurality of side-wall structures 902.

FIG. 9G is a perspective view of an MCM 916 similar to the MCM 104 in FIG. 1, but FIG. 9G includes landing pads or contacts 918 formed of a conductive surface on which solder, conductive paste, or another substance is deposited for physically and electrically coupling the side-wall structures 902 to the substrate 920. The side-wall structures of views 900A-900F are formed to mirror the contacts 918, to align with the contacts 918 and provide EMI protection for the SMDs 922.

Figure 10A:
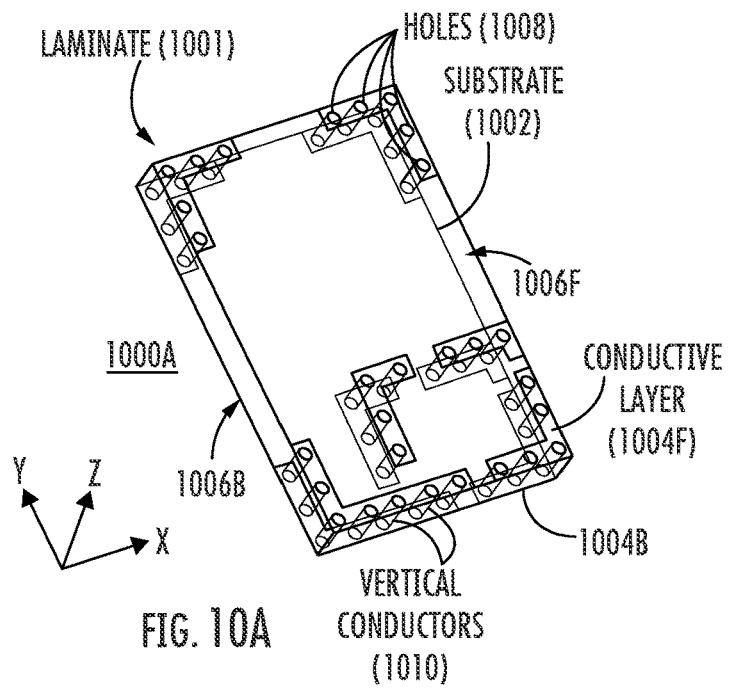
FIGS. 10A-10F illustrate stages of fabrication in an example of forming the EMI shields shown in FIGS. 9A-9G from a laminate substrate coupled to a shield carrier.
Figure 10B:
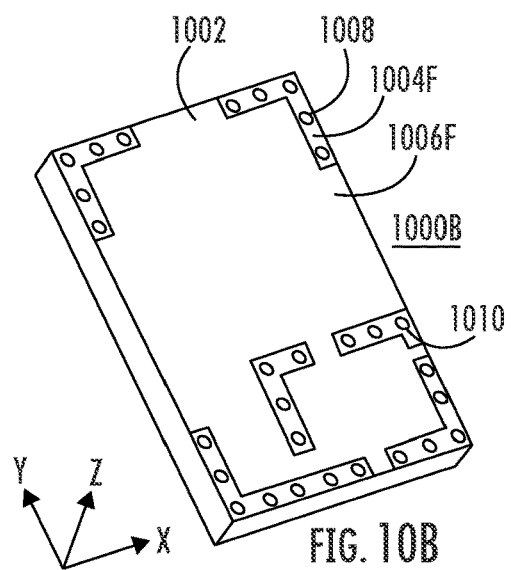

FIGS. 10A-10F includes illustrations 1000A-1000F showing details of fabricating the shield structure 901 including the side-wall structures 902 coupled to the shield carrier 904 in FIG. 9A-9F. Illustration 1000A in FIG. 10A shows a view of a laminate 1001 typically employed in the manufacture of PCBs. Though not shown here, the laminate 1001 is initially provided with an insulating substrate 1002 clad between conductive layers 1004F and 1004B fully covering front and back sides 1006F and 1006B, respectively, of the insulating substrate 1002. The conductive layers 1004F and 1004B may be copper layers, for example. In illustration 1000A, the insulating substrate 1002 is an unshaped wall medium from which side-wall structures 902 will be formed in a subtractive process. The insulating substrate 1002 is shown here as being transparent to simplify an understanding of other features. As noted above, the side-wall structures 902 of the shield structure 901 in FIGS. 9A-9F are formed from the laminate 1001 to coincide with SMDs mounted on a particular substrate. In areas where side-wall structures 902 are to be provided, holes 1008 are formed through the conductive layer 1004F, the substrate 1002, and the conductive layer 1004B and the holes 1008 are plated or filled with a conductive material to form a hollow or solid cylindrical vertical conductor 1010. In this regard, the vertical conductors 1010 include at least a portion of a side-wall of a hole 1008 extending through a thickness (e.g., in the Z-axis direction) of the insulating substrate 1002. The plated or filled conductive material of the vertical conductors 1010 is electrically coupled to the conductive layers 1004F and 1004B. The holes 1008 need not be round and the vertical conductors 1010 are not limited to being cylindrical. The conductive layers 1004F and 1004B are etched or otherwise patterned to have a desired footprint for the side-wall structures 902 to mirror a layout of SMDs on a substrate, An opaque view of the laminate 1001 in illustration 1000A is shown in illustration 1000B in FIG. 10B.

Figure 10C:
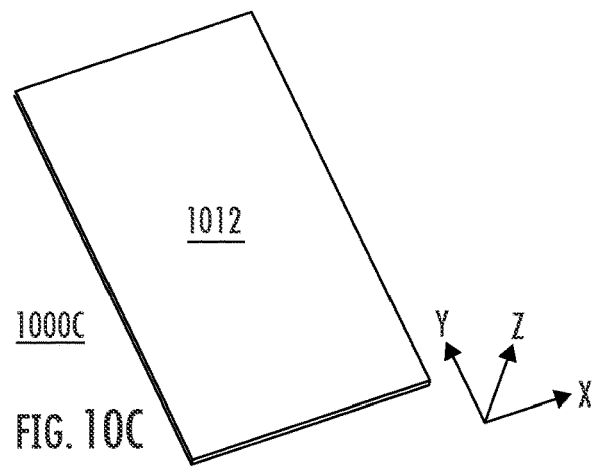
Figure 10D:
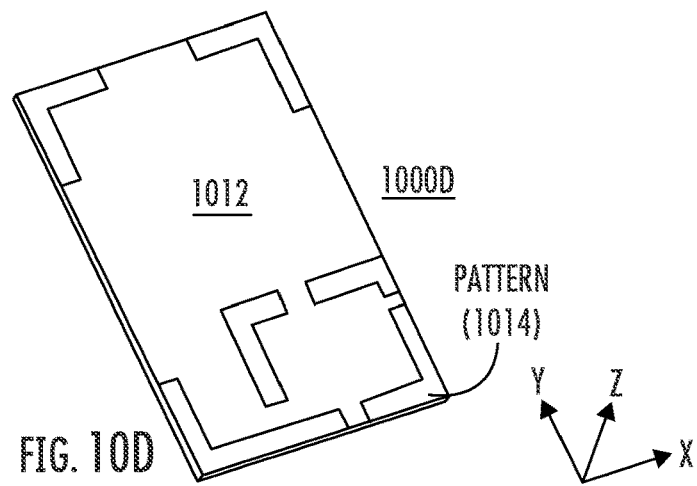
Figure 10E:
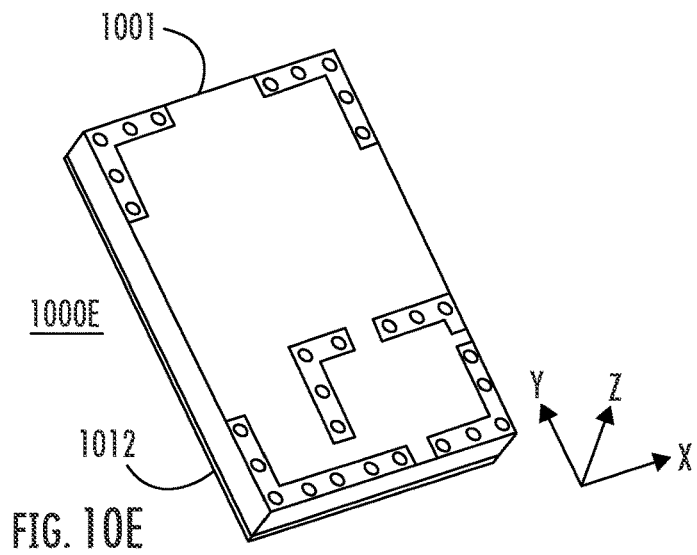
Figure 10F:
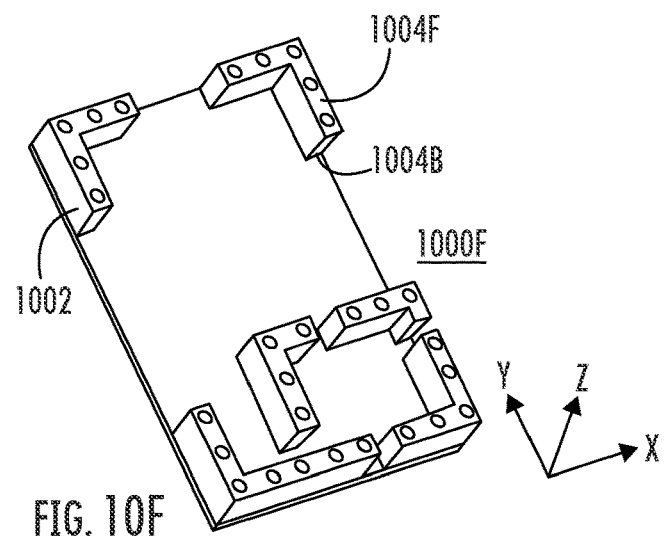

In FIG. 10C, illustration 1000C is a view of a plate 1012 that forms the shield carrier 904 in FIGS. 9A-9F having an area corresponding to the laminate 1001. As described further below, the shield carrier 904 may take many different forms and is not limited to the plate 1012. For example, as shown in view 900A of FIG. 9A, the shield carrier 904 may include openings 910 to allow molding compound to be disposed on the surface of a substrate. In illustration 1000D of FIG. 10D, a solder, adhesive, or other substance is formed in a pattern 1014 on the shield carrier 904 to mirror the patterned conductive layer 1004B on the back side 1006B of the laminate 1001 in illustration 1000D to adhere or couple the conductive layer 1004B to the insulating substrate 1002 in those areas. The back side 1006B of the laminate 1001 may form the top surface of the side-wall structures 902 when the shield structure 901 is disposed on a substrate. In FIG. 10E, illustration 1000E shows the laminate 1001 coupled to the plate 1012. At this stage, the conductive layers 1004B and 1004F have been shaped to correspond to an EMI shield for a particular substrate, and the vertical conductors 1010 have been formed through the insulating substrate 1002. As shown in illustration 1000F in FIG. 10F, the insulating substrate 1002 is further shaped into the side-wall structures 902 by decoupling and removing, from the shield carrier 904, portions of the insulating substrate 1002 on which the bottom conductive layer 1004B is not disposed. In other words, the side-wall structures 902 are formed from the insulating substrate 1002 by removing any portion of the insulating substrate 1002 that is not between the patterned conductive layers 1004F and 1004B. The resulting structure in illustration 1000F corresponds to the shield structure 901 including the side-wall structures 902 and the shield carrier 904 in FIGS. 9A-9F. Employing the shield carrier 904 as a structural support, the arrangement of side-wall structures 902 may be disposed on the surface of a substrate, as shown in FIGS. 11A-11F.

Figure 11A:
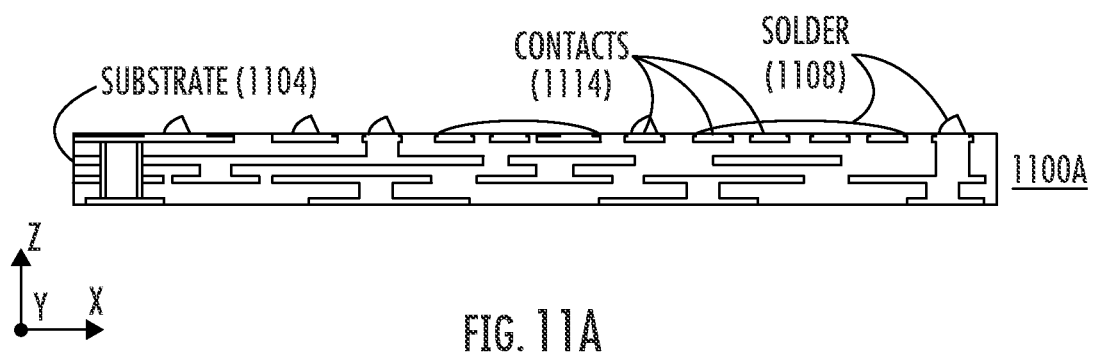
FIGS. 11A-11F are cross-sectional side views during fabrication of an MCM including an EMI shield of the second example in which the shield carrier includes a conductive layer according to the method illustrated in FIG. 7.
Figure 11B:
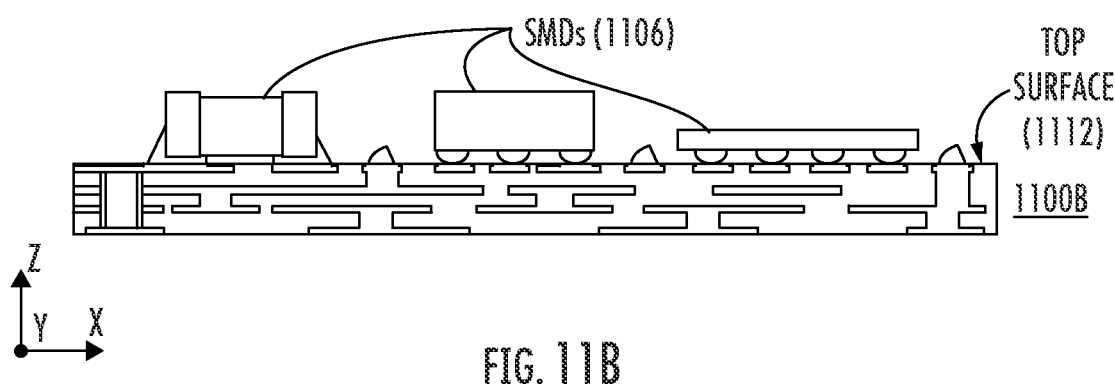

FIG. 11A-11F illustrate a sequence of cross-sectional side views of stages 1100A-1100F of fabrication of an MCM 1101 including an EMI shield 1102 employing the shield structure 901 of FIGS. 9A-9F and 10A-10F. Stage 1100A in FIG. 11A shows a substrate 1104 on which SMDs 1106 will be mounted for interconnection. The substrate 1104 in stage 1100A includes a solder 1108, conductive paste, or other known electrically conductive adhesive material to provide a physical attachment of the SMDs 1106 and a shield structure 1110 to a top surface 1112 of the substrate 1104 and also provide electrical coupling to contacts 1114 on the top surface 1112. Stage 1100B in FIG. 11B shows the SMDs 1106 mounted on the contacts 1114 on the substrate 1104.

Figure 11C:
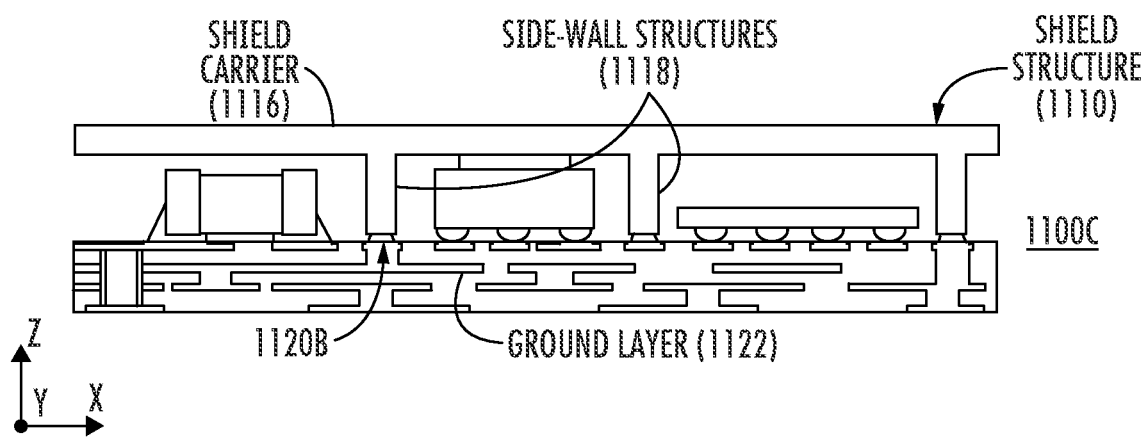
Figure 11D:
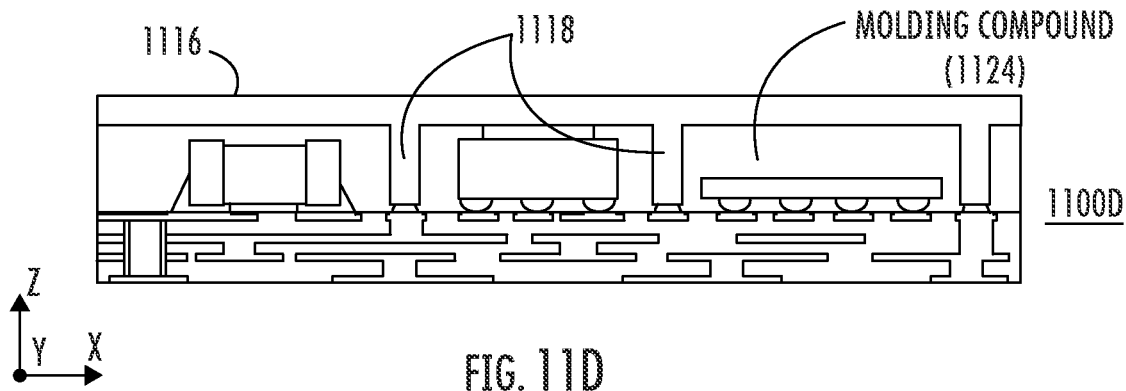

Stage 1100C of FIG. 11C shows the shield structure 1110, including a shield. carrier 1116 and side-wall structures 1118 disposed on the top surface 1112 of the substrate 1104. The side-wall structures 1118 on the shield carrier 1116 are collectively disposed (e.g., in unison) on sides of the SMDs 1106 by placement of the shield structure 1110. Bottom end portions 1120B of vertical conductors (not shown) within the side-wall structures 1118 are electrically coupled to contacts 1114 coupled to a ground layer 1122 in the substrate 1104. Stage 1100D in FIG. 11D shows a molding compound 1124 disposed on the SMDs 1106 under the shield carrier 1116. The molding compound 1124 may be disposed by any known method such as compression molding in which the molding compound 1124 is forced through openings (not shown here) in the shield carrier 1116 or by transfer molding in which the molding compound 1124 is forced through openings in the side-wall structures 1118.

Figure 11E:
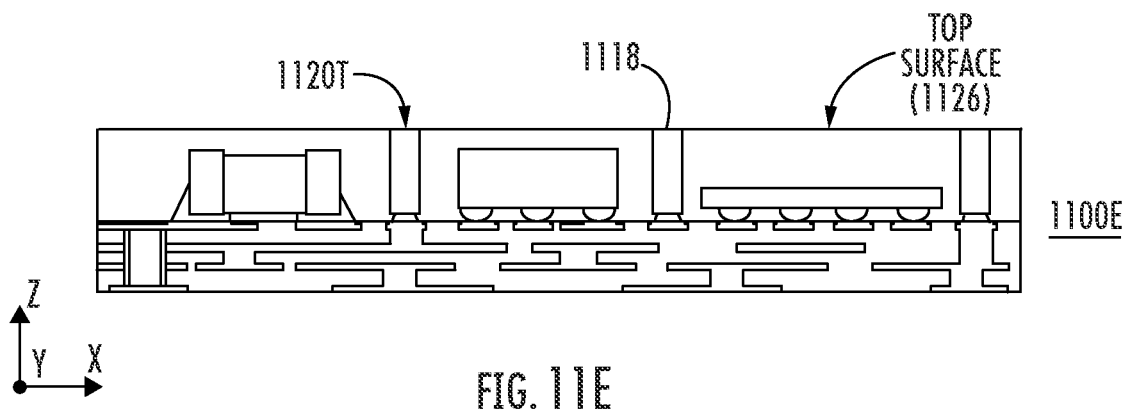
Figure 11F:
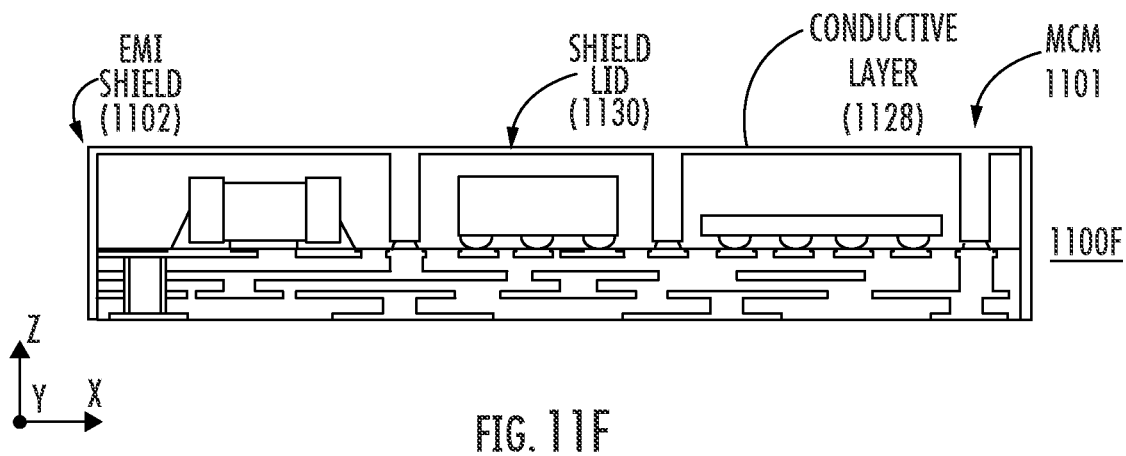

In the example in FIGS. 11A-11F, the shield carrier 1116 is a structure on which the side-wall structures 1118 are formed and is employed to transport the side-wall structures 1118 to be disposed on the top surface 1112 of the substrate 1104. The shield carrier 1116 is also employed to contain the molding compound 1124 and/or limit the distribution of the molding compound 1124 to less than all of the SMDs 1106. In this regard, the shield carrier 1116 may he formed of any material that serves these purposes. In this example, the shield carrier 1116 is not included in the EMI shield 1102 and is removed. Stage 1100E in FIG. 11E shows the MCM 1101 after the shield carrier 1116 is removed, exposing a top surface 1126 of the MCM 1101 including the side-wall structures 1118 and the molding compound 1124. Although not shown here, top end portions 1120T of the vertical conductors within the side-wall structures 1118 are also exposed. The top surface 1126 of the MCM 1101 may be sanded, ground, or otherwise processed to be planar, as needed. In stage 1100F of FIG. 11F, a conductive layer 1128 is disposed on the top surface 1126 of the MCM 1101, and the conductive layer 1128 is electrically coupled to the top end portions 1120T of the vertical conductors to form a shield lid 1130 of the EMI shield 1102.

FIGS. 12A-12D are another sequence of cross-sectional views of stages 1200A-1200D of fabricating another example of an MCM 1201 including an EMI shield 1202 including side-wall structures 1204 as disclosed above. In stage 1200A in FIG. 12A, SMDs 1206 mounted on a substrate 1208 may generate a significant amount of heat that must be dissipated from the MCM 1201. To address this problem, a shield structure 121) mounted on a top surface 1212 of the substrate 1208 includes heat sinks 1214A and 1214B disposed over two of the SMDs 1206. In this example, the heat sinks 1214A and 1214B are intended to remain as part of the EMI shield 1202 but the shield carrier 1216 is removable. Therefore, in this example, the shield carrier 1216 may be formed of an insulating material 1218. To provide thermal conduction from the SMD 1206 to the heat sink 1214B, the MCM 1201 also includes a thermal material 1220 (e.g., thermally conductive metal, such as copper) disposed on the SMD 1206 before the shield structure 1210 is disposed on the top surface 1212. The thermal material 1220 is in contact with both the SMD 1206 and the heat sink 1214B.

Figure 12A:
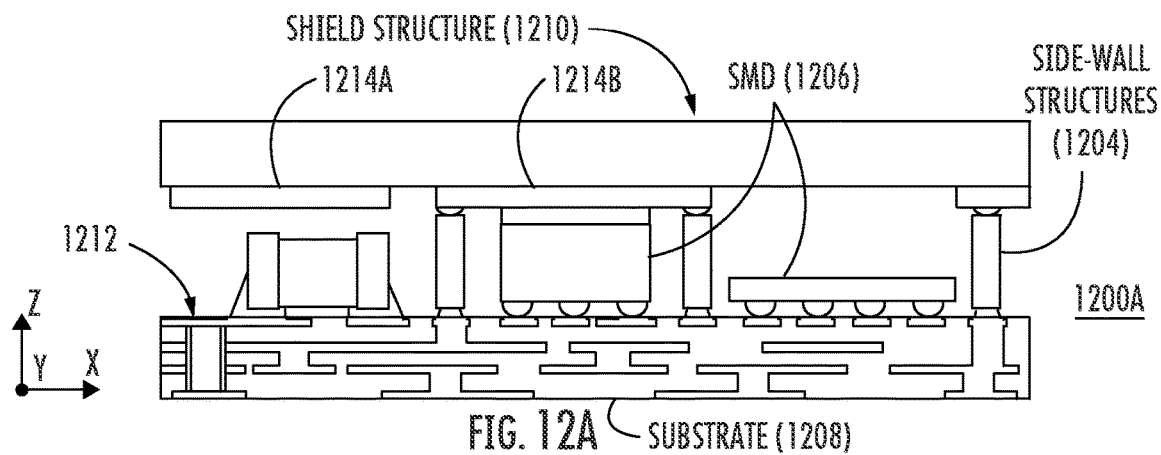
FIGS. 12A-12D illustrate cross-sectional side views of an MCM including an EMI shield of the second example in a first alternative aspect in which the shield carder includes heat sinks coupled to a removable insulating substrate.
Figure 12B:
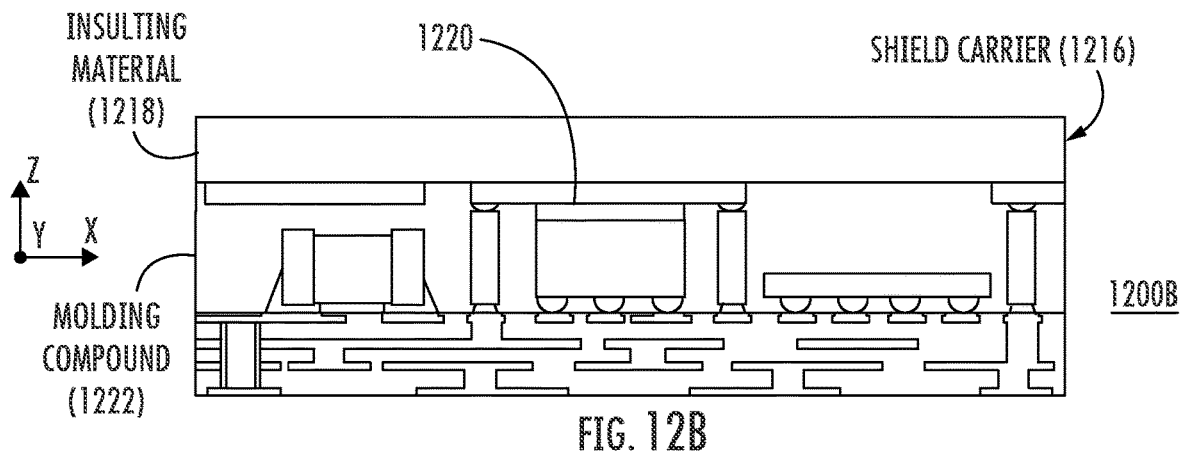
Figure 12C:
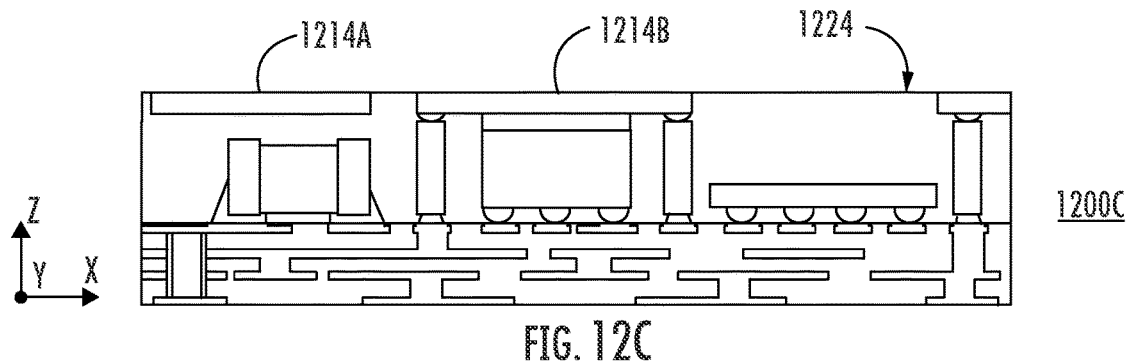
Figure 12D:
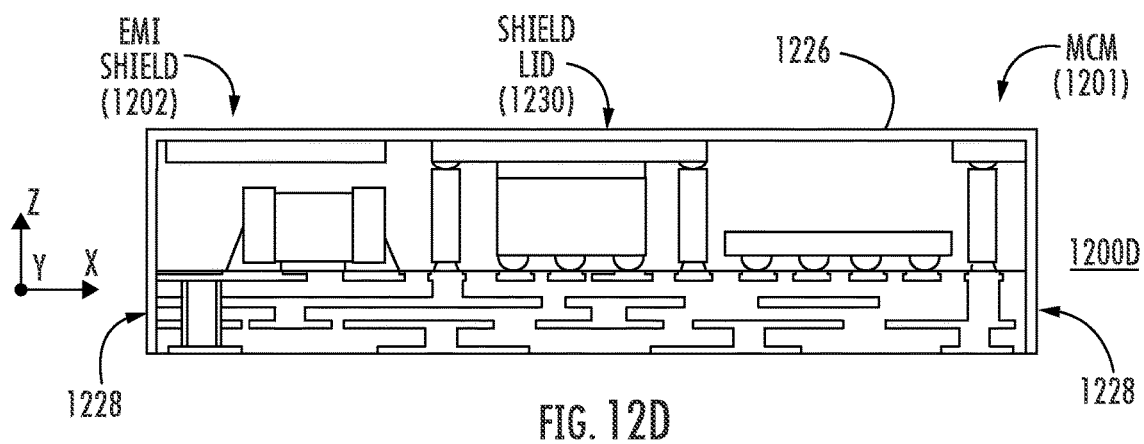

Stage 1200B in FIG. 1213 illustrates the deposition of a molding compound 1222 on the top surface 1212 and under the shield carrier 1216. As discussed previously, the molding compound 1222 may be disposed by any known methods. Stage 1200C in FIG. 12C shows the MCM 1201 after the removable shield carrier 1216 has been removed, leaving the heat sinks 1214A and 1214B embedded in the molding compound 1222 and included in a top surface 1224 of the MCM 1201. As discussed above, the top surface 1224 may be processed or planarized. Stage 1200D in FIG. 12D shows a conductive layer 1226 has been deposited on the top surface 1224 and on sides 1228 of the MCM 1201 to form a shield lid 1230 of the EMI shield 1202. In one example, the conductive layer 1226 may be a combination of metals (not shown here) including a seed layer of stainless steel, a layer of highly conductive copper, and a top layer of stainless steel to provide a passivated exterior surface. These layers may be applied by sputtering or other known means. Other metals used in different combinations can also be used to form the conductive layer 1226 that forms the shield lid 1230.

Figure 13:
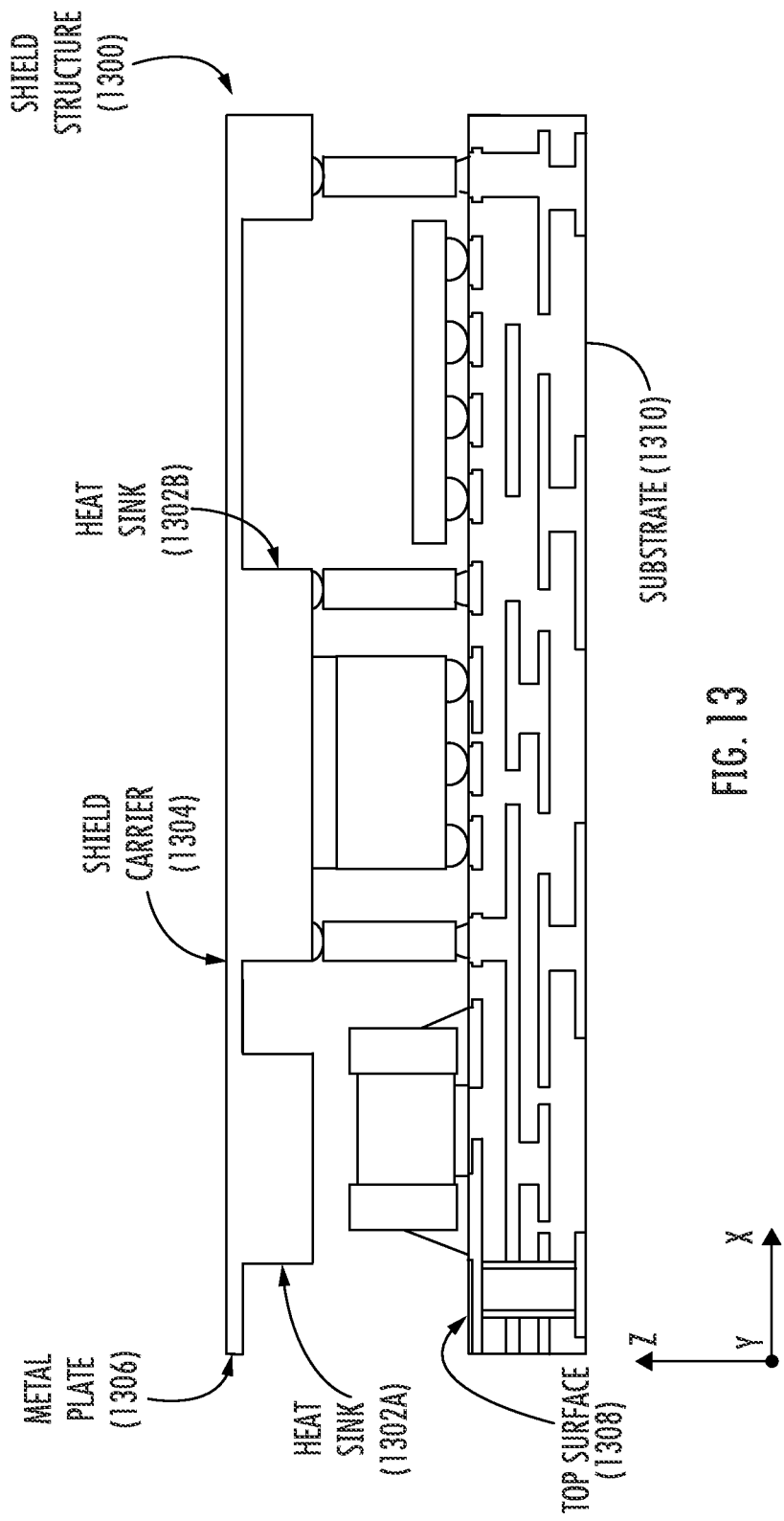
FIG. 13 is a cross-sectional side view of a stage of fabrication of an MCM including an EMI shield of the second example in a second alternative aspect in which the shield carrier includes a half-etched metal layer to form heat sinks.

FIG. 13 is an illustration of an alternative shield structure 1300 to the shield structure 1210 in FIGS. 12A-12D. This example includes heat sinks 1302A and 1302B corresponding to heat sinks 1214A and 121413 in FIGS. 12A-12D. However, in this example, the shield carrier 1304 is not an insulating material 1218 to which the heat sinks 1302A and 1302B are attached. Here, the shield carrier 1304 and the heat sinks 1302A and 1302B are formed from a metal slab, layer, or plate 1306 that is partially etched to be thinned in regions in which no heat sink is desired and allowed to remain thicker in the regions of the heat sinks 1302A and 1302B. FIG. 13 shows the shield structure 1300 mounted on a top surface 1308 of a substrate 1310, which is similar to stage 1200A in FIG. 12A. Fabrication continues as shown in FIGS. 12A-12D except that the shield carrier 1304 to be removed is formed of a layer of the metal plate 1306. Removing the shield carrier 1304 by grinding, etching, sanding, or other known methods leaves the heat sinks 1302A and 1302B embedded in a molding compound (not shown).

Figure 14A:
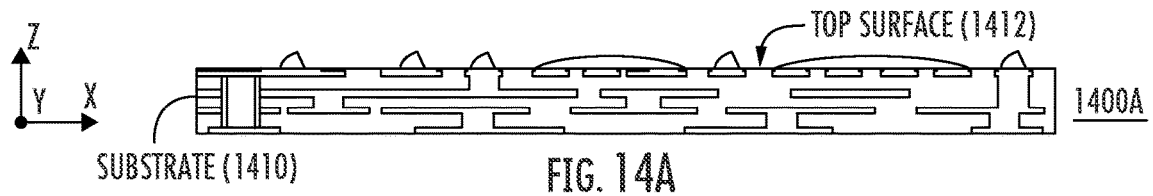
FIGS. 14A-14G illustrate cross-sectional side views during fabrication of an MCM including an EMI shield of a third example in which the shield carrier is non-removable and is included in the shield lid.
Figure 14B:
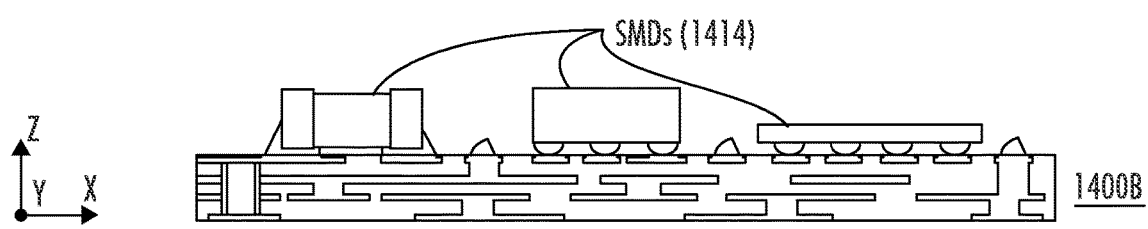
Figure 14C:
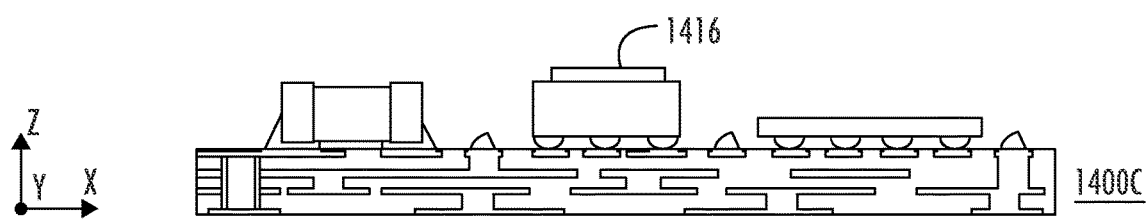
Figure 14D:
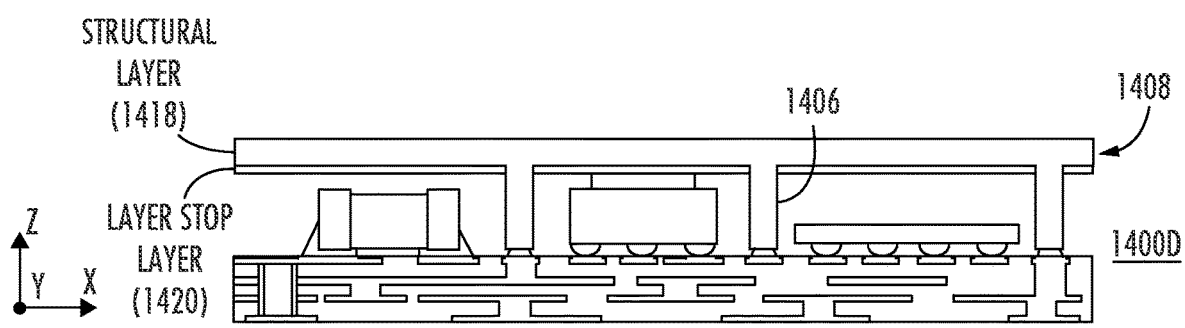

FIGS. 14A-14G are a sequence of cross-sectional views of stages 1400A-1400G of fabrication in another example of an MCM 1401 including an EMI shield 1402 formed from a shield structure 1404. The shield structure 1404 includes side-wall structures 1406 and a shield carrier 1408. Stage 1400A in FIG. 14A illustrates a substrate 1410 having a top surface 1412 on which SMDs 1414 will be mounted, which is shown in stage 1400B in FIG. 14B. In stage 1400C of FIG. 14C a thermal material 1416 has been applied to an SMD 1414. In FIG. 14D, stage 1400D shows the shield structure 1404 is disposed on the top surface 1412 of the substrate 1410. In this example, the shield carrier 1408 includes a structural layer 1418, such as copper, for example, and a laser stop layer 1420. The structural layer 1418 may be highly conductive, such as metal, and may remain on the MGM 1401 as part of a shield lid 1422 of the EMI shield 1402. During or after fabrication of the side-wall structures 1406 on the shield carrier 1408, the laser stop layer 1420, which may be nickel (Ni), tungsten (W), or titanium (Ti). for example, is applied to the structural layer 1418. The laser stop layer 1420 may be a conductive material, such as a metal, to serve as part of the shield lid 1422, and also provides thermal conduction of heat from the SMD 1414 through the thermal material 1416 and to the structural layer 1418 of the shield carrier 1408.

Figure 14E:
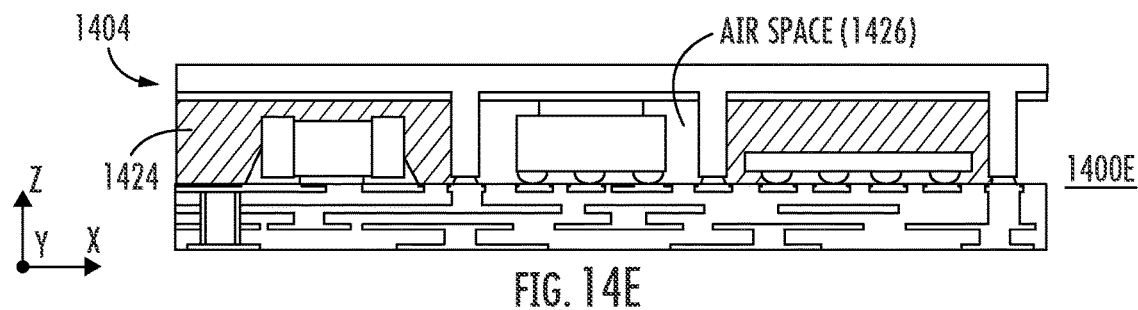

Stage 1400E in FIG. 14E shows a molding compound 1424 disposed on two of the SMDs 1414, but not on the SMD 1414 on which the thermal material 1416 is disposed. As discussed above, if there are no openings in the shield carrier 1408 or the side-wall structures 1406 enclosing a particular SMD 1414, the molding compound 1424 is prevented from being disposed on the SMD 1414. In this example, the thermal material 1416 in an air space 142.6 may provide better thermal dissipation of heat generated in the SMD 1414 than would occur if the molding compound 1424 was also disposed on the SMD 1414. The air space 1426 may be provided to accommodate MEMs devices that have moving parts or for any devices whose operation, including piezoelectric vibrations, would be impeded by the molding compound 1424.

Figure 14F:
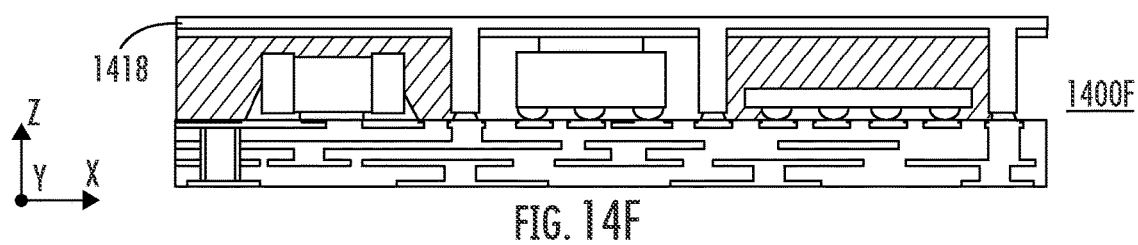
Figure 14G:
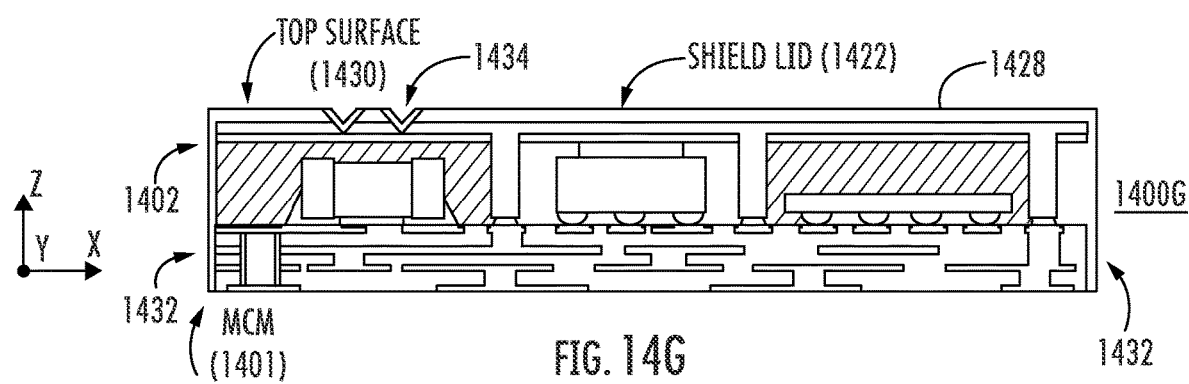

Stage 1400F in FIG. 14F shows that the structural layer 1418 of the shield carrier 1408 has been thinned (e.g., by sanding, grinding, or chemical processing). This may be done to reduce a vertical height profile of the MCM 1401, for example. Stage 1400(g) in FIG. 14 shows that a conductive layer 1428 has been disposed on a top surface 1430 and side surfaces 1432 of the MCM 1401. The conductive layer 1428, the structural layer 1418, and the laser stop layer 1420 are all included in the shield lid 1422 of the EMI shield 1402, The conductive layer 1428 on the side surfaces 1432 may be employed as a vertical conductor for EMI protection on the side surfaces 1432. Stage 1400G in FIG. 14G also shows that laser marks 1434 have been cut or engraved into the top surface 1430 of the MCM 1401. In particular, portions of the conductive layer 1428 and the structural layer 1418 have been removed but the material of the laser stop layer 1420 takes longer to remove under a laser, which helps to prevent penetration of the laser marks 1434 into the MCM 1401 beneath the laser stop layer 1420. In this manner, unintended capacitive coupling to the SMD 1414 below the laser marks 1434 is avoided.

Figure 15A:
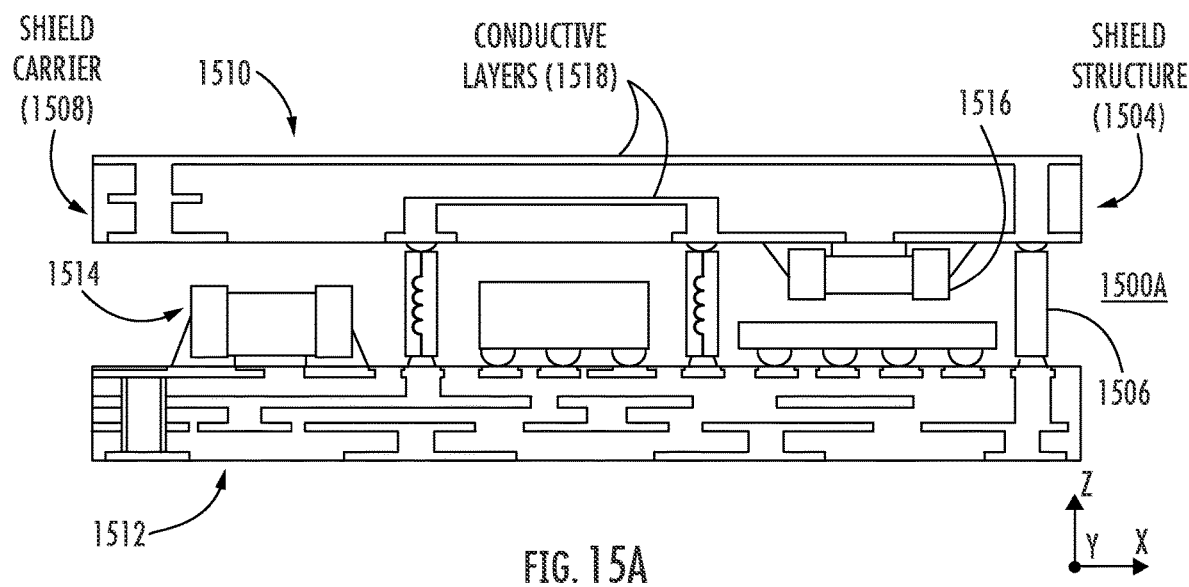
FIGS. 15A and 15B are cross-sectional side views of an MCM including an EMI shield of the third example in a first variation in which the shield carrier is a multi-layer substrate on which an electronic component may be mounted.
Figure 15B:
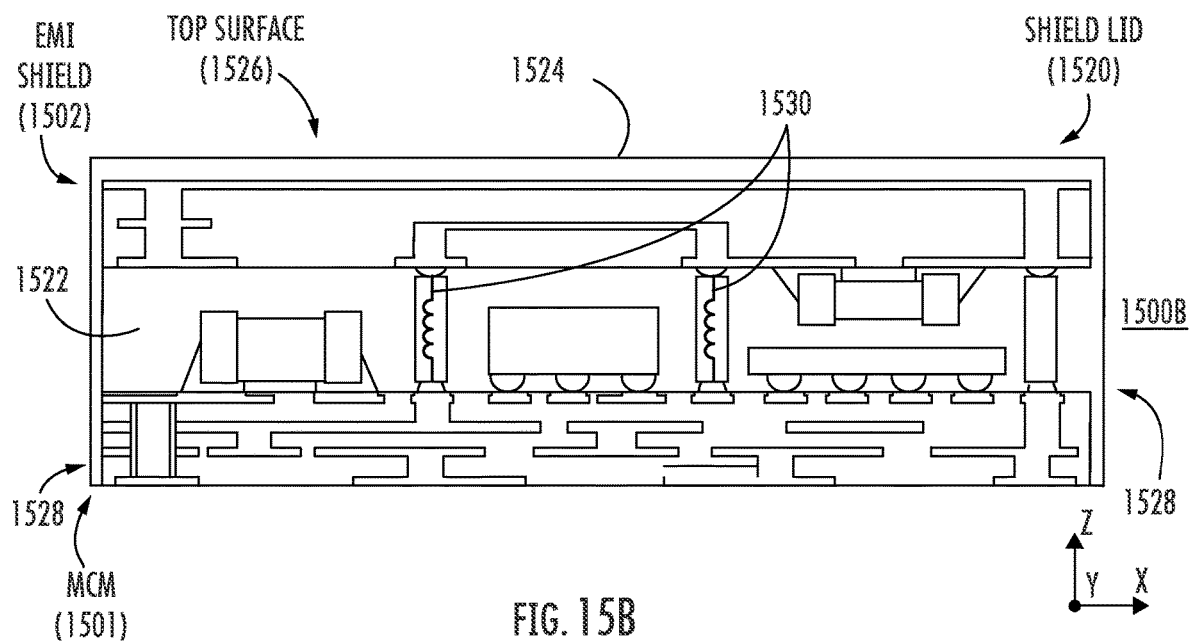

FIGS. 15A and 15B are cross-sectional views 1500A and 1500E of another example of an MCM 1501 including an EMI shield 1502 fabricated using a shield structure 1504 that includes side-wall structures 1506 and a shield carrier 1508. In this example, the shield carrier 1508 is formed of a substrate 1510, which may be similar to a substrate 1512 on which SMDs 1514 are mounted. In this regard, the substrate 1510 may also include an SMD 1516. In this example, the side-wall structures 1506 may be formed on the substrate 1510 as described above and, after removal of the unused portions of the wall medium from the substrate 1510 the SMD 1516 may be mounted thereon and the shield structure 1504 can be mounted as shown on the substrate 1510. Conductive layers 1518 in the substrate 1510 are at least a portion of a shield lid 1520 of the EMI shield 1502. View 1500B shows the MCM 1501 including a molding compound 1522 and a conductive layer 1524 disposed on a top surface 1526 and side surfaces 1528. Thus, this example, the shield lid 1520 includes the shield carrier 1508 and the conductive layers 1518 and the SMD 1516 is disposed on a surface of the shield lid 1520 and surrounded by the molding compound 1522. FIGS. 15A and 15B also show vertical conductors 1530, which may be inductors and/or conductive routing traces 1530, formed within the side-wall structures 1506 electrically separated from the vertical conductors forming the EMI shield 1502. Thus, the vertical conductors 1530 of FIG. 15A and the vertical conductors 1010 of FIG. 10A are examples of vertical conductors that are disposed at least one of on and inside of a side-wall structure 1506. In other words, the vertical conductors may be disposed on the side-wall structure 1506, inside the side-wall structure 1506, or both on and inside the side-wall structure 1506. The vertical conductors 1530 may be employed in the electrical circuits of the MCM 1501. Including the vertical conductors 1530 inside the side-wall structures 1506 saves space on the surfaces of the substrates 1510 and 1512.

Figure 16A:
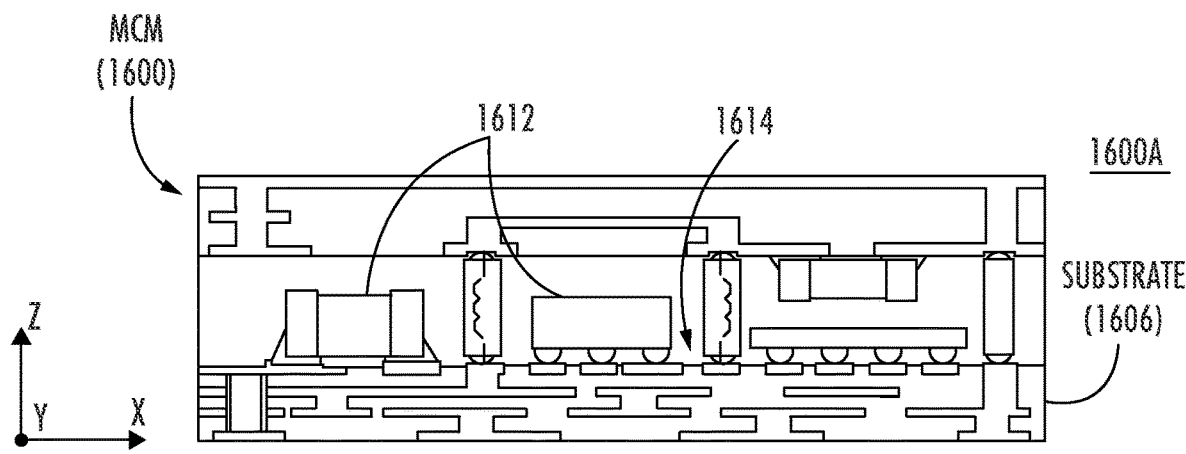
FIGS. 16A-16G are cross-sectional side views in fabrication stages of an MCM in FIG. 16H including a Land Grid Array (LGA) extender on a bottom-side surface of a substrate to electrically couple the substrate to package connections and provide an EMI shield to bottom-side devices.
Figure 16B:
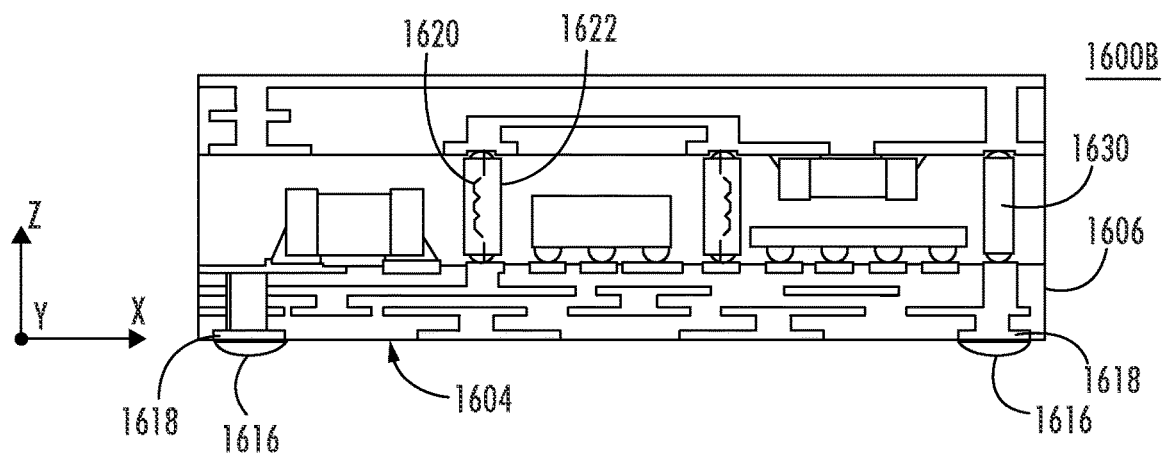
Figure 16C:
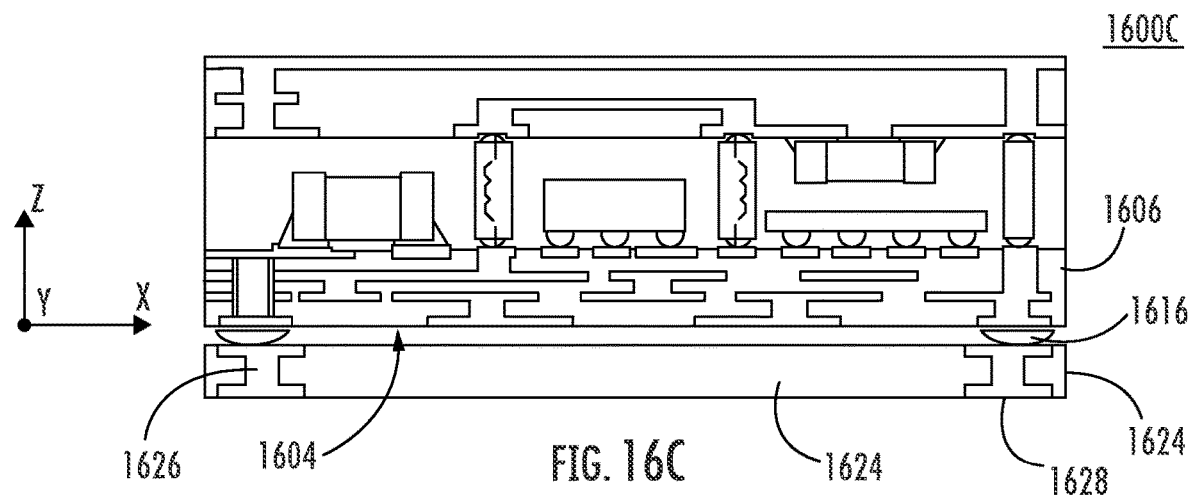
Figure 16D:
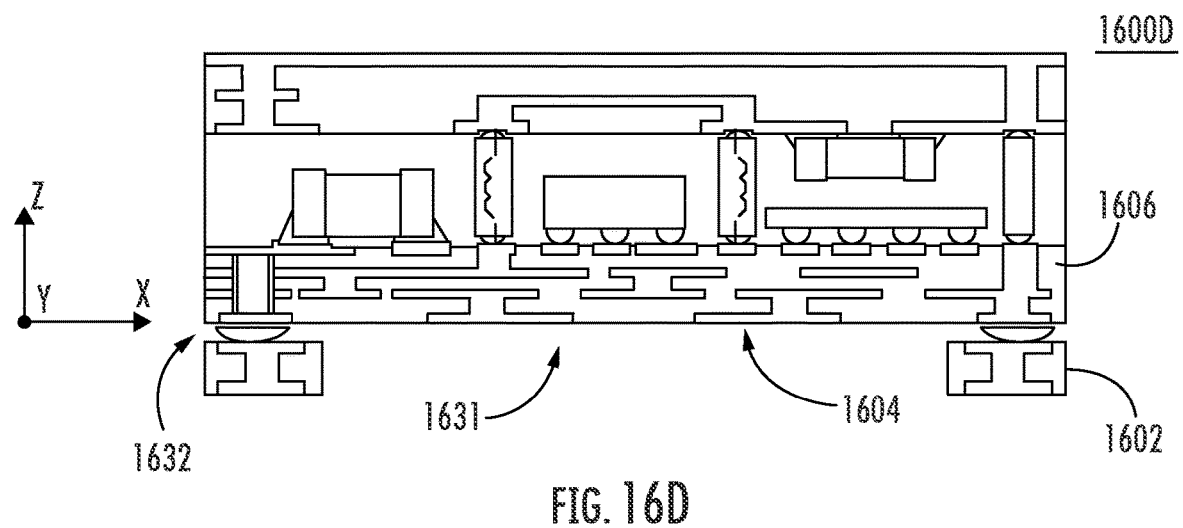
Figure 16E:
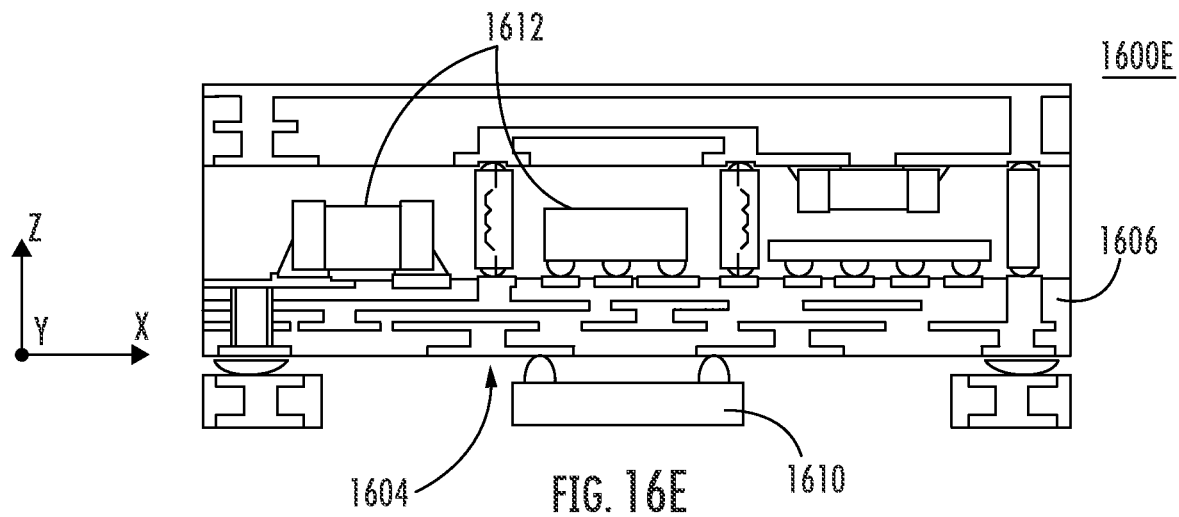
Figure 16F:
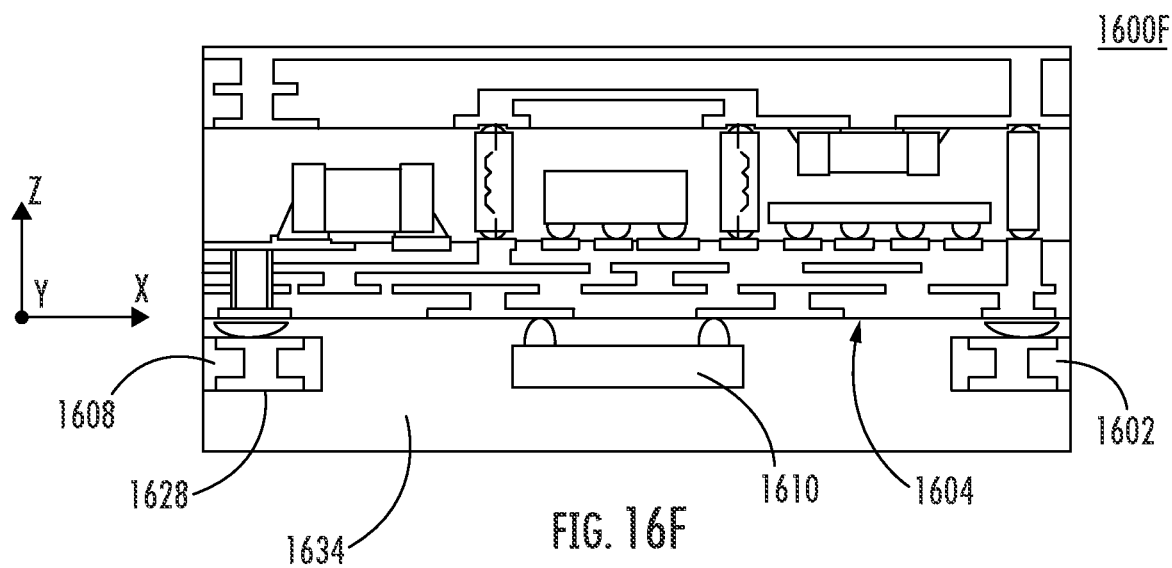
Figure 16G:
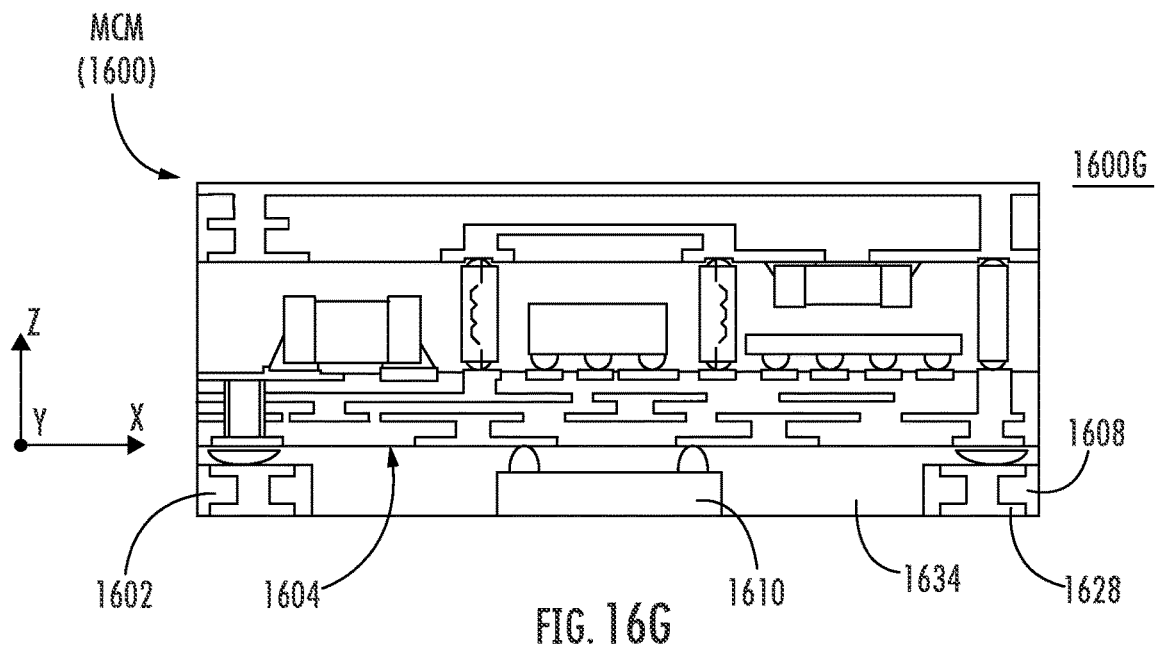
Figure 16H:
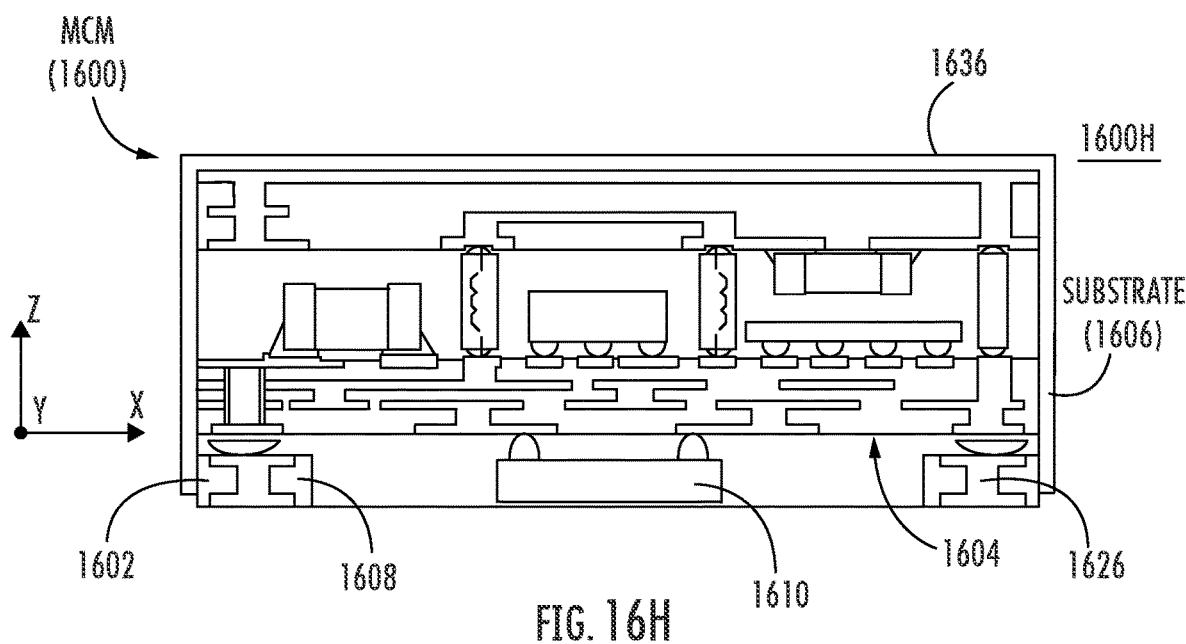

FIGS. 16A-16H illustrate cross-sectional side views at fabrication stages 1600A-1600H for making an MCM 1600 as shown in FIG. 16H that includes wall structures 1602 disposed on a bottom side 1604 of a substrate 1606 to form land-grid array (LGA) pad extenders 1608 that also provide EMI shielding for an SMD 1610 disposed on the bottom side 1604. The substrate 1606 in FIG. 16A may correspond to the substrate 1512 in FIG. 15A. The MCM 1600 includes a plurality of SMDs 1612 disposed on a top surface 1614 (e.g., a first side surface) of the substrate 1606. The MCM 1600 in the fabrication stage 1600A corresponds to the MCM 1501 in the cross-sectional view 15A, for example, but the LGA extenders 1608 may be formed on a bottom side (e.g., opposite to the primary side on which SMDs are disposed) of any example of an MCM fabricated by any process or method described or illustrated herein.

The cross-sectional side view of fabrication stage 1600B in FIG. 16B shows solder paste 1616 disposed in locations on the bottom side 1604 of the substrate 1606. The bottom side 1604 of the substrate 1606 includes contacts 1618 that may be LGA pads for connecting the MCM 1600 in a package or device, for example. The solder paste 1616 may also be referred to as solder bumps 1616. The locations of the solder paste 1616 may correspond to the contacts 1618 on the bottom side 1604. The solder paste 1616 may be disposed or deposited by any known method, such as printing, for example. The contacts 1618 may be coupled to a ground layer (not shown) in the substrate 1606 and further coupled to vertical conductors 1620 in side-wall structures 1622 on the top surface 1614.

The cross-sectional side view of fabrication stage 1600C in FIG. 16C shows a substrate 1624 coupled to the bottom side 1604 of the substrate 1606. The substrate 1624 may be formed by any of the processes disclosed herein, such as those illustrated in FIGS. 5A-5C or 10A-10F, for example. The substrate 1624 includes vertical conductors 1626 extending through a thickness of the substrate 1624 (e.g., in the Z-axis direction) orthogonal to the bottom surface 1604. The substrate 1624 is attached to the bottom side 1604 such that the vertical conductors 1626 are electrically coupled to the substrate 1606 by the solder paste 1616. The vertical conductors 1626 extend through the thickness of the substrate 1624 to provide contacts 1628 that may be used for interconnecting the MCM 1600 in a package or device.

The cross-sectional side view of fabrication stage 1600D in FIG. 16D shows the substrate 1624 shaped to form the wall structures 1602. The substrate 1624 may be shaped by, for example, laser cutting to remove unwanted portions (e.g., in the X-axis direction and Y-axis direction) of the substrate 1624. The remaining wall structures 1630 form the LGA pad extenders 1608 extending from the contacts (LGA pads) 1618 on the substrate 1606. The wall structures 1630 may be located such that a perimeter is formed around a pocket or cavity 1631 on the bottom surface 1604 of the substrate 1606 surrounded by the wall structures 1602. In some examples, the wall structures 1630 may be located at or near edges 1632 of the substrate 1606 such that the bottom surface 1604 is surrounded by the wall structures 1602.

The cross-sectional side view of fabrication stage 1600E in FIG. 16E shows the electrical device or SMD 1610 electrically coupled to the bottom surface 1604 of the substrate 1606. The SMD 1610 may be electrically connected to any of the SMDs 1612. The SMD 1610 may be mounted on the bottom side 1604 to avoid a need for the substrate 1606 to have a larger surface area, sacrificing some additional vertical package height to minimize package area.

The cross-sectional side view of fabrication stage 1600F in FIG. 16F shows a molding compound 1634 disposed on the bottom surface 1604 of the substrate 1606. The molding compound 1634 may initially extend farther (e.g., in the Z-axis direction) from the bottom surface than the SMD 1610 and the contacts 1628 on the wall structures 1602. In other words, the molding compound 1634 may disposed to a thickness that covers or encapsulates the SMD 1610 and the wall structures 1602. A tape assisted mold process may allow for the SMD 1610 to be encapsulated without covering the LGA pad extenders 1608.

The cross-sectional side view of fabrication stage 1600G in FIG. 16G shows the molding compound 1634 thinned to expose the contacts 1628 of the LGA pad extenders 1608. The molding compound 1634 may be thinned by known methods such at least one of a mechanical or chemical polishing or grinding. Thinning the molding compound 1634 is an optional step that may only be necessary if the molding compound disposed on the bottom surface 1604 has a thickness that covers or fully encapsulates the wall structures 1602. If the tape assisted mold process is used to dispose the molding compound 1634, the thinning shown as a change from FIG. 16F to FIG. 16G is not needed. The molding compound 1634 continues to encapsulate the SMD 1610 even if the contacts 1628 are exposed. In this regard, the MCM 1600 may be coupled to an external circuit but the SMD 1610 remains protected by the molding compound 1634.

The cross-sectional side view of fabrication stage 1600H in FIG. 16H shows the MCM 1600 including a conductive (e.g., metal) layer 1636 coating top and side surfaces to provide an EMI shield. The conductive layer 1636 may correspond to the conductive layer 1524 in FIG. 15B. The vertical conductors 1626 in the wall structures 1602 around the SMD 1610 may provide additional lateral (e.g., in the X-axis direction and Y-axis direction) EMI shielding of the SMD 1610. Thus, LGA pad extenders 1608 of the MCM 1600 provide additional EMI shielded area on the substrate 1606 that may be used for SMDs 1610, reducing the surface area needed for an EMI shielded MCM or IC package in a device.

An exemplary MCM including an EMI shield with configurable side-wall structures in which vertical conductors are disposed on or inside a wall medium that is mounted on a substrate surface to electrically couple an EMI shield lid to a ground layer as shown in FIGS. 8A-8E, 11A-11F, 12A-12D, 13, 14A-14G, 15A-15B, and 16A-16H, and according to any aspects disclosed herein, may be provided in or integrated into any processor-based device. Examples, without limitation, include a set top box, an entertainment unit, a navigation device, a communications device, a fixed location data. unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 17:
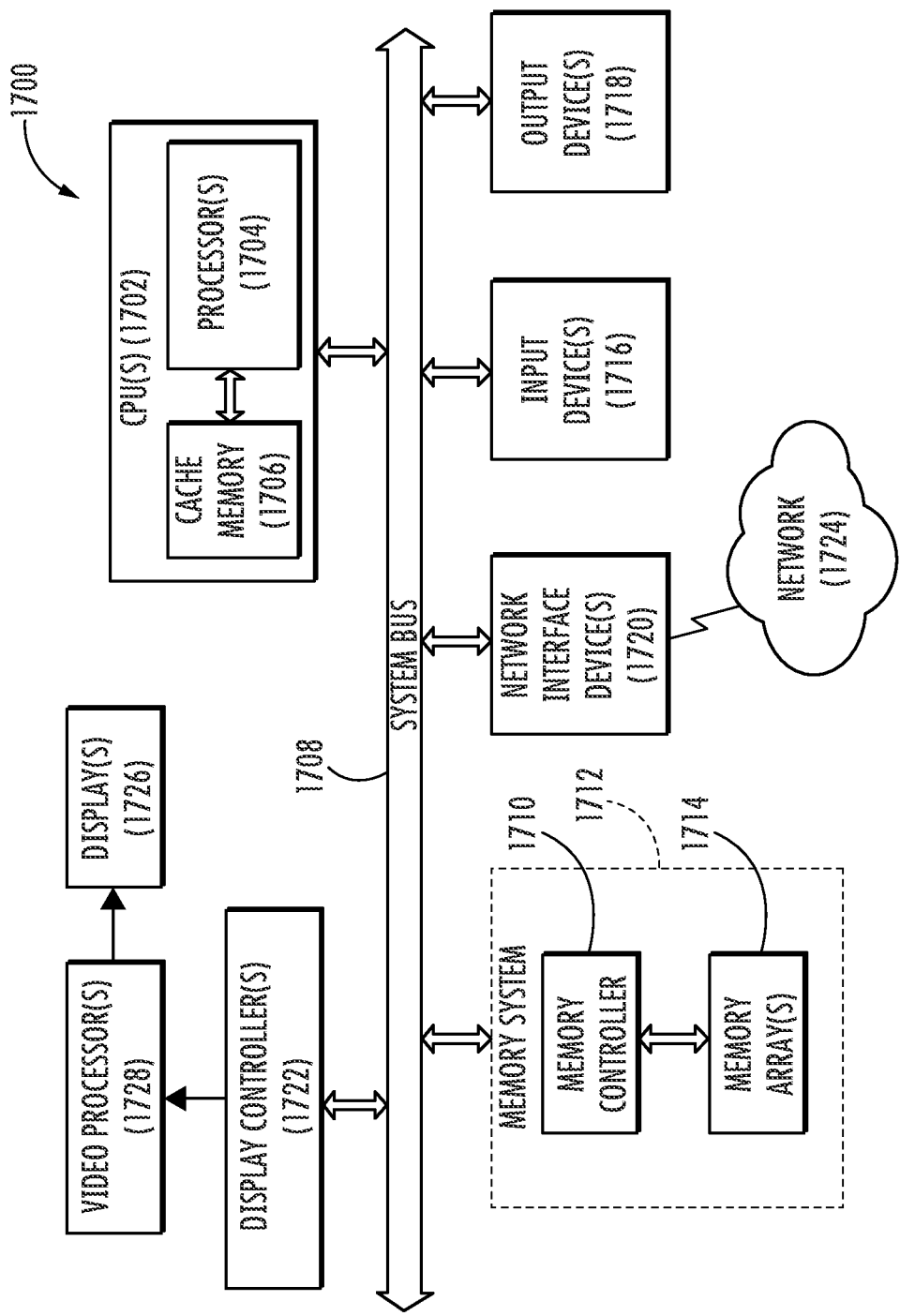
FIG. 17 is a block diagram of an exemplary processor-based system that can include an exemplary MCM including an EMI shield with configurable side-wall structures in which vertical conductors are disposed on a wall medium that is mounted on a substrate surface to electrically couple an EMI shield lid to a ground layer as shown in FIGS. 8A-8E, 11A-11F, 12A-12D, 13, 14A-14G, 15A-15B; and 16H.

In this regard, FIG. 17 illustrates an example of a processor-based system 1700 including an MCM including an EMI shield with configurable side-wall structures in which vertical conductors are disposed on or inside a wall medium that is mounted on a substrate surface to electrically couple an EMI shield lid to a ground layer as shown in FIGS. 8A-8E, 11A-11F, 12A-12D, 13, 14A-14G, 15A-15B, and 16A-16H, and according to any aspects disclosed herein. In this example, the processor-based system 1700 includes one or more central processor units (CPUs) 1702, which may also be referred to as CPU or processor cores, each including one or more processors 1704. The CPU(s) 1702 may have cache memory 1706 coupled to the processor(s) 1704 for rapid access to temporarily stored data. As an example, the processor(s) 1704 could include an MCM including an EMI shield with configurable side-wall structures in which vertical conductors are disposed on or inside a wall medium that is mounted on a substrate surface to electrically couple an EMI shield lid to a ground layer as shown in FIGS. 8A-8E, 11A-11F, 12A-12D, 13, 14A-14G, 15A-15B, and 16A-16H, and according to any aspects disclosed herein. The CPU(s) 1702 is coupled to a system bus 1708 and can intercouple master and slave devices included in the processor-based system 1700. As is well known, the CPU(s) 1702 communicates with these other devices by exchanging address, control, and data information over the system bus 1708. For example, the CPU(s) 1702 can communicate bus transaction requests to a memory controller 1710 as an example of a slave device. Although not illustrated in FIG. 17, multiple system buses 1708 could be provided, wherein each system bus 1708 constitutes a different fabric.

Other master and slave devices can be connected to the system bus 1708. As illustrated in FIG. 17, these devices can include a memory system 1712 that includes the memory controller 1710 and one or more memory arrays 1714, one or more input devices 1716. one or more output devices 1718, one or more network interface devices 1720, and one or more display controllers 1722, as examples. Each of the memory system 1712, the input device(s) 1716, the output device(s) 1718, the network interface device(s) 1720, and the display controller(s) 1722 can include an MCM including an EMI shield with configurable side-wall structures in which vertical conductors are disposed on or inside a wall medium that is mounted on a substrate surface to electrically couple an EMI shield lid to a ground layer as shown in FIGS. 8A-8E, 11A-11F, 12A-12D, 13, 14A-14G, 15A-15B, and 16A-16H, and according to any aspects disclosed herein. The input device(s) 1716 can include any type of input device, including, but not limited to, input keys, switches, voice processors, etc. The output device(s) 1718 can include any type of output device, including, but not limited to, audio, video, other visual indicators, etc. The network interface device(s) 1720 can be any device configured to allow exchange of data to and from a network 1724. The network 1724 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1720 can be configured to support any type of communications protocol desired.

The CPU(s) 1702 may also be configured to access the display controller(s) 1722 over the system bus 1708 to control information sent to one or more displays 1726. The display controller(s) 1722 sends information to the display(s) 1726 to be displayed via one or more video processors 1728, which process the information to be displayed into a format suitable for the display(s) 1726. The display(s) 1726 can include any type of display, including, but not limited to, a cathode ray tube (CRT), a liquid crystal display (LCD), a plasma display, a light emitting diode (LED) display, etc. The display controller(s) 1722, display(s) 1726, and/or the video processor(s) 1728 can include an MCM including an EMI shield with configurable side-wall structures in which vertical conductors are disposed on or inside a wall medium that is mounted on a substrate surface to electrically couple an EMI shield lid to a ground layer as shown in FIGS. 8A-8E, 11A-11F, 12A-12D, 13, 14A-14G, 15A-15B, and 16A-16H, and according to any aspects disclosed herein.

Figure 18:
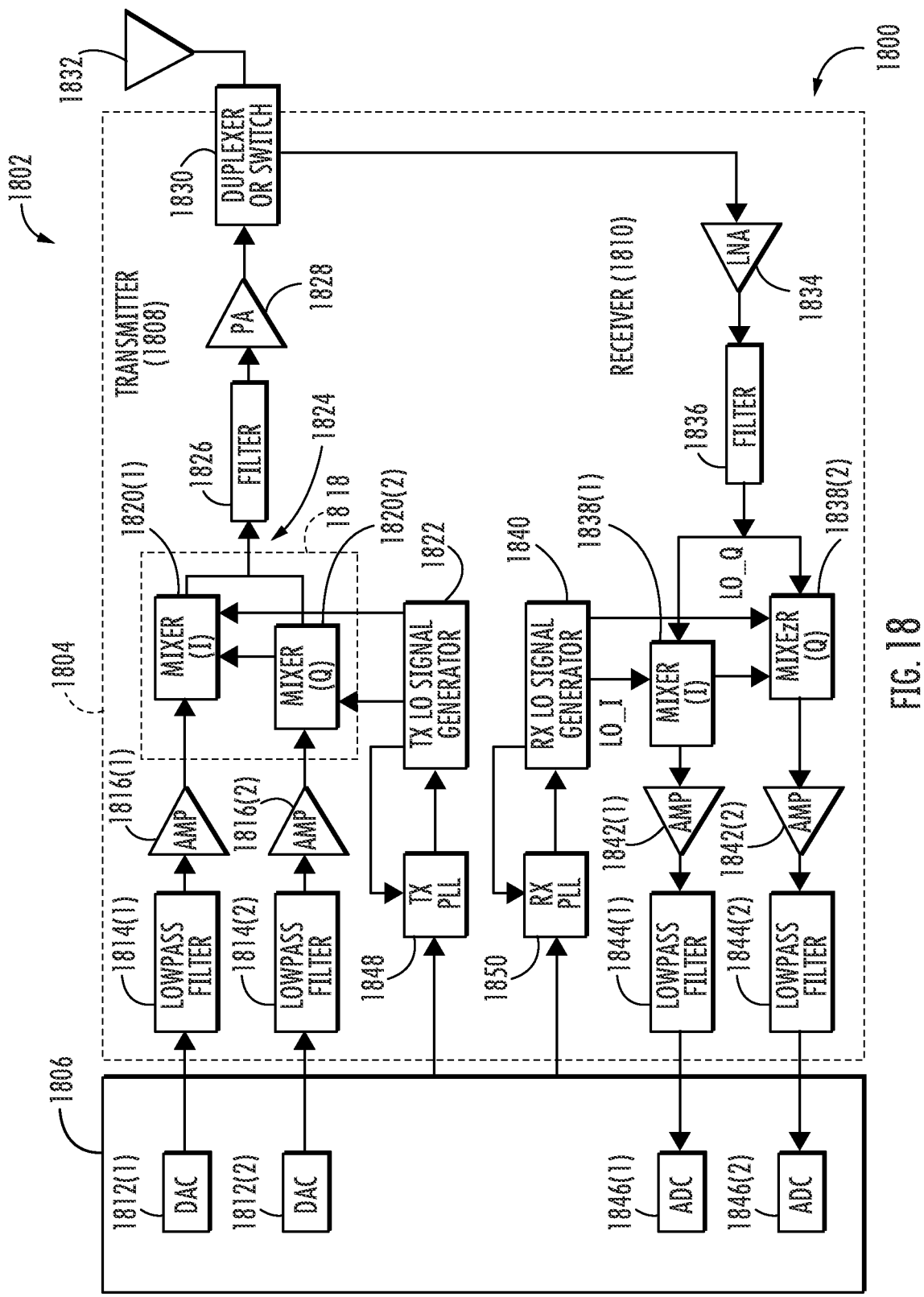
FIG. 18 is a block diagram of an exemplary wireless communications device that includes radio frequency (RF) components formed from an integrated circuit (IC), wherein any of the components therein can include an exemplary MCM including an EMI shield with configurable side-wall structures in which vertical conductors are disposed on a wall medium that is mounted on a substrate surface to electrically couple an EMI shield lid to a ground layer as shown in FIGS. 8A-8E, 11A-11F, 12A-12D, 13, 14A-14G, 15A-15B; and 16H.

FIG. 18 illustrates an exemplary wireless communications device 1800 that includes radio frequency (RF) components formed from an IC 1802, wherein any of the components therein can include an MCM including an EMI shield with configurable side-wall structures in which vertical conductors are disposed on or inside a wall medium that is mounted on a substrate surface to electrically couple an EMI shield lid to a ground layer as shown in FIGS. 8A-8E, 11A-11F, 12A-12D, 13, 14A-14G, 15A-15B, and 16A-16H, and according to any aspects disclosed herein. The wireless communications device 1800 may include or be provided in any of the above-referenced devices, as examples. As shown in FIG. 18, the wireless communications device 1800 includes a transceiver 1804 and a data processor 1806. The data processor 1806 may include a memory to store data and program codes. The transceiver 1804 includes a transmitter 1808 and a receiver 1810 that support bi-directional communications. in general, the wireless communications device 1800 may include any number of transmitters 1808 and/or receivers 1810 for any number of communication systems and frequency bands. All or a portion of the transceiver 1804 may be implemented on one or more analog ICs, RF ICs (RFICs), mixed-signal ICs, etc.

The transmitter 1808 or the receiver 1810 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1810. In the direct-conversion architecture, a signal is frequency-converted between RF and baseband in one stage. The super-heterodyne and direct-conversion architectures may use different circuit blocks and/or have different requirements. In the wireless communications device 1800 in FIG. 18, the transmitter 1808 and the receiver 1810 are implemented with the direct-conversion architecture.

In the transmit path, the data processor 1806 processes data to be transmitted and provides I and Q analog output signals to the transmitter 1808. In the exemplary wireless communications device 1800, the data processor 1806 includes digital-to-analog converters (DACs) 1812(1), 1812(2) for converting digital signals generated by the data processor 1806 into the I and Q analog output signals, e.g., I and Q output currents, for further processing.

Within the transmitter 1808, lowpass filters 1814(1), 1814(2) filter the I and Q analog output signals, respectively, to remove undesired signals caused by the prior digital-to-analog conversion. Amplifiers (AMPs) 1816(1), 1816(2)

amplify the signals from the lowpass filters 1814(1), 1814(2), respectively, and provide I and Q baseband signals. An upconverter 1818 upconverts the I and Q baseband signals with I and Q transmit (TX) local oscillator (LO) signals through mixers 1820(1), 1820(2) from a TX LO signal generator 1822 to provide an upconverted signal 1824. A filter 1826 filters the upconverted signal 1824 to remove undesired signals caused by the frequency upconversion as well as noise in a receive frequency band, A power amplifier (PA) 1828 amplifies the upconverted signal 1824 from the filter 1826 to obtain the desired output power level and provides a transmitted RF signal. The transmitted RF signal is routed through a duplexer or switch 1830 and transmitted via an antenna 1832.

In the receive path, the antenna 1832 receives signals transmitted by base stations and provides a received RF signal, which is routed through the duplexer or switch 1830 and provided to a low noise amplifier (LNA) 1834. The duplexer or switch 1830 is designed to operate with a specific receive (RX)-to-TX duplexer frequency separation, such that RX signals are isolated from TX signals. The received RF signal is amplified by the LNA 1834 and filtered by a filter 1836 to obtain a desired RF input signal. Downconversion mixers 1838(1), 1838(2) mix the output of the filter 1836 with I and Q RX LO signals (i.e., LO_I and LO_Q) from an RX LO signal generator 1840 to generate I and Q baseband signals. The I and Q baseband signals are amplified by AMPs 1842(1), 1842(2) and further filtered by lowpass filters 1844(1). 1844(2) to obtain I and Q analog input signals, which are provided to the data processor 1806. In this example, the data processor 1806 includes analog-to-digital converters (ADCs) 1846(1), 1846(2) for converting the analog input signals into digital signals to be further processed by the data processor 1806.

In the wireless communications device 1800 of FIG. 18, the TX LO signal generator 1822 generates the I and Q TX LO signals used for frequency upconversion, while the RX LO signal generator 1840 generates the I and Q RX LO signals used for frequency downconversion. Each LO signal is a periodic signal with a particular fundamental frequency. A TX phase-locked loop (PLL) circuit 1848 receives timing information from the data processor 1806 and generates a control signal used to adjust the frequency and/or phase of the TX LO signals from the TX LO signal generator 1822 Similarly, an RX PLL circuit 1850 receives timing information from the data processor 1806 and generates a control signal used to adjust the frequency and/or phase of the RX LO signals from the RX LO signal generator 1840.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but, is to be accorded the widest scope consistent with the principles and novel features disclosed herein.

Implementation examples are described in the following numbered clauses:

1. A multi-component module (MCM), comprising:
    an electrical device mounted on a top surface of a substrate comprising a ground layer; and
    an electromagnetic interference (EMI) shield disposed adjacent to the top surface of the substrate and proximate to the electrical device, the EMI shield comprising:
        a shield lid adjacent to a first side of the electrical device; and
        a side-wall structure disposed adjacent to at least a second side of the electrical device, the side-wall structure comprising:
            a wall medium; and
            a vertical conductor disposed at least one of on and inside the wall medium and configured to electrically couple the shield lid to the ground layer of the substrate.
2. The MCM of clause 1, wherein:
    the shield lid comprises a conductive layer extending parallel to the top surface of the substrate, adjacent to the electrical device and the side-wall structure; and
    the side-wall structure extends in a direction orthogonal to the top surface of the substrate between the top surface of the substrate and the shield lid.
3. The MCM of clause 1 or clause 2, wherein:
    a first end portion of the vertical conductor is electrically coupled to the shield lid; and
    a second end portion of the vertical conductor is electrically coupled to the ground layer of the substrate.
4. The MCM of any of clause 1 to clause 3, wherein the vertical conductor disposed on the wall medium further comprises a conductive material disposed on a surface of the wall medium.
5. The MCM of any of clause 1 to clause 4, wherein the surface of the wall medium on which the conductive material is disposed comprises at least a portion of a side-wall of a hole through the wall medium, the hole having a longitudinal axis extending through a thickness of the wall medium.
6. The MCM of any of clause 1 to clause 5, wherein the side-wall structure extends continuously on the first side of the electrical device extending in a first direction and on the second side of the electrical device extending in a second direction orthogonal to the first direction.
7. The MCM of any of clause 1 to clause 6, wherein:
    the side-wall structure extends around the electrical device to form an enclosure between the top surface of the substrate and the shield lid; and
    the shield lid further comprises openings through which a molding compound may be disposed in the enclosure.
8. The MCM of any of clause 1 to clause 7, wherein:
    the side-wall structure extends around the electrical device to form an enclosure between the top surface of the substrate and the shield lid; and
    the enclosure forms an air space around the electrical device.
9. The MCM of any of clause 2 to clause 8, wherein the conductive layer of the shield lid is a metal passivation layer disposed on a top surface of the MCM.
10. The MCM of any of clause 2 to clause 9, wherein the conductive layer of the shield lid comprises a first conductive layer and the shield lid further comprises a second conductive layer under the first conductive layer and having a higher conductivity than the first conductive layer.
11. The MCM of any of clause 2 to clause 10, wherein:
    the conductive layer of the shield lid is a first conductive layer;
    the shield lid further comprises a heat sink layer over the electrical device; and
    the MCM further comprises a substance other than air and a molding compound to thermally couple the electrical device to the heat sink layer.
12. The MCM of any of clause 2 to clause 11, wherein:
    the conductive layer of the shield lid is a first conductive layer;
    the shield lid further comprises a substrate comprising at least a second conductive layer and an insulating material; and
    the vertical conductor configured to electrically couple the shield lid is electrically coupled to the second conductive layer.
13. The MCM of any of clause 1 to clause 12, further comprising a second electrical device disposed on a surface of the shield lid in an enclosure formed by the EMI shield.
14. The MCM of any of clause 2 to clause 13, wherein:
    the wall medium of the side-wall structure further comprises an insulating material; and
    the side-wall structure further comprises one of an inductor and a conductor trace used for routing enclosed within the insulating material and is configured to be electrically coupled to an electrical component in the MCM.
15. The MCM of any of clause 1 to clause 14, further comprising a second electrical device and a second side-wall structure disposed adjacent to the second electrical device.
16. The MCM of any of clause 1 to clause 15, wherein:
    the substrate further comprises:
        a bottom surface opposite to the top surface; and
        bottom contacts on the bottom surface configured to couple the MCM to an external circuit; and
    the MCM further comprises a wall structure disposed on the bottom surface of the substrate, the wall structure comprising:
        a second wall medium; and
        a vertical conductor disposed at least one of on and inside the second wall medium, the vertical conductor electrically coupled to the bottom contacts.
17. The MCM of any of clause 1 to clause 16, further comprising a second electrical device mounted on the bottom surface of the substrate.
18. The MCM of any of clause 1 to clause 17, integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

19. A method of fabricating a multi-component module (MGM), the method comprising:
disposing a shield structure adjacent to a top surface of a substrate and adjacent to an electrical device on the top surface of the substrate, the shield structure comprising a side-wall structure comprising:
a wall medium; and
a vertical conductor disposed at least one of on and inside the wall medium, a bottom end portion of the vertical conductor configured to electrically couple to a ground layer in the substrate;
disposing a molding compound on the top surface of the substrate; and
disposing a conductive layer on a top surface of the MCM, the conductive layer electrically coupled to a top end portion of the vertical conductor to form at least a portion of a shield lid of an electromagnetic interference (EMI) shield.

20. The method of clause 19, wherein forming a shield structure further comprises fabricating the side-wall structure, comprising:
disposing a bottom conductive layer corresponding to a shape of the side-wall structure on a bottom surface of an unshaped wall medium;
shaping the unshaped wall medium to form the side-wall structure according to a shape of the bottom conductive layer; and
disposing the vertical conductor at least one of on and inside the wall medium extending in a height direction, orthogonal to a length direction and a width direction, between the bottom conductive layer on a bottom surface of the wall medium and a top surface of the wall medium, electrically coupling the vertical conductor to the bottom conductive layer.

21. The method of clause 20, wherein:
fabricating the side-wall structure further comprises forming a hole in the wall medium in the height direction of the wall medium; and
disposing the vertical conductor on the wall medium further comprises disposing a conductive material on a side surface of the hole in the wall medium to form a cylindrical conductor.

22. The method of any of clause 19 to clause 21, wherein disposing the shield structure adjacent to the electrical device further comprises placing the side-wall structure on the top surface of the substrate such that the bottom conductive layer on the wall medium is disposed on a contact electrically coupled to the ground layer.

23. The method of any of clause 19 to clause 22, further comprising reducing a thickness of the molding compound above the top surface of the substrate to form a planar surface including a top surface of the side-wall structure.

24. The method of any of clause 19 to clause 23, wherein disposing the molding compound on the top surface of the substrate further comprises disposing the molding compound by compression molding or transfer molding.

25. The method of any of clause 20 to clause 24, wherein:
forming the shield structure of the EMI shield further comprises forming a shield carrier and coupling the top surface of the wall medium to the shield carrier; and
shaping the unshaped wall medium further comprises decoupling, from the shield carrier, portions of the unshaped wall medium on which the bottom conductive layer is not disposed.

26. The method of any of clause 19 to clause 25, wherein disposing the shield structure adjacent to the top surface of the substrate and adjacent to the electrical device further comprises disposing the shield structure including the side-wall structure coupled to the shield carrier on the top surface of the substrate.

27. The method of any of clause 19 to clause 26, further comprising disposing the molding compound on the top surface of the substrate through openings in the shield carrier.

28. The method of any of clause 19 to clause 27, further comprising disposing the molding compound on the top surface of the substrate through openings in the side-wall structure.

29. The method of any of clause 25 to clause 28, further comprising thinning a thickness of the shield carrier in a direction orthogonal to the top surface of the substrate.

30. The method of clause 29, wherein thinning the shield carrier in the direction orthogonal to the top surface of the substrate further comprises completely removing the shield carrier.

31. The method of any of clause 25 to clause 30, wherein:
the shield carrier comprises a thermally conductive layer having a first thickness and including a thicker section having a second thickness greater than the first thickness disposed over the electrical device; and
thinning the shield carrier comprises thinning the shield carrier by at least the first thickness and leaving a portion of the shield carrier comprising the thicker section disposed over the electrical device to provide a heat sink for the electrical device.

32. The method of any of clause 25 to clause 30, wherein:
the shield carrier comprises a substrate coupled to a heat sink disposed over the electrical device; and
thinning the shield carrier comprises removing the substrate and leaving at least a portion of the heat sink disposed over the electrical device.

33. The method of any of clause 25 to clause 32, wherein the shield carrier comprises at least a portion of the shield lid on the top surface of the MCM.

34. The method of any of clause 25 to clause 33, further comprising disposing a thermal material on the electrical device to thermally couple the electrical device to the shield carrier.

35. The method of any of clause 19 to clause 33, further comprising disposing the molding compound on the top surface of the substrate wherein an enclosure formed over the electrical device by the EMI shield prevents disposing the molding compound within the enclosure.

36. The method of any of clause 19 to clause 35, wherein:
fabricating the MCM further comprises laser engraving the shield lid to a maximum depth corresponding to a laser stop layer on a bottom surface of the shield carrier.

37. The method of any of clause 19 to clause 33, wherein:
disposing the shield structure adjacent to the electrical device further comprises disposing an upper substrate comprising at least one conductive layer and an insulating material over the electrical device; and
electrically coupling the shield lid to the top end portion of the vertical conductor in the side-wall structure further comprises electrically coupling the top end portion of the vertical conductor to a contact on a surface of the upper substrate.

38. The method of any of clause 19 to clause 37, further comprising disposing a wall structure on a bottom surface of the substrate opposite to the top surface, the wall structure comprising:

a second wall medium; and a second vertical conductor disposed at least one of on and inside the second wall medium, the second vertical conductor coupled to a contact on the bottom surface of the substrate and configured to couple the MCM to an external circuit.

39. The method of any of clause 19 to clause 38, further comprising disposing a second electronic device on the bottom surface of the substrate.

What is claimed is:

1. A multi-component module (MCM), comprising:
    an electrical device mounted on a top surface of a substrate comprising a ground layer; and
    an electromagnetic interference (EMI) shield disposed adjacent to the top surface of the substrate and proximate to the electrical device, the EMI shield comprising:
        a shield lid adjacent to a first side of the electrical device; and
        a side-wall structure disposed adjacent to at least a second side of the electrical device, the side-wall structure comprising:
            a wall medium; and
            a vertical conductor disposed at least one of on and inside the wall medium and configured to electrically couple the shield lid to the ground layer of the substrate,
        wherein:
            the shield lid comprises a conductive layer extending parallel to the top surface of the substrate, adjacent to the electrical device and the side-wall structure;
            the side-wall structure extends in a direction orthogonal to the top surface of the substrate between the top surface of the substrate and the shield lid;
            the surface of the wall medium on which the conductive material is disposed comprises at least a semi-cylindrical surface of a side-wall having a longitudinal axis extending through a thickness of the wall medium; and
            the vertical conductor disposed on the wall medium further comprises a semi-cylindrical conductive layer disposed on the semi-cylindrical surface and between the surface and the electrical device.

2. The MCM of claim 1, wherein:
    a first end portion of the vertical conductor is electrically coupled to the shield lid; and
    a second end portion of the vertical conductor is electrically coupled to the ground layer of the substrate.

3. The MCM of claim 1, wherein the side-wall structure extends continuously on the first side of the electrical device extending in a first direction and on the second side of the electrical device extending in a second direction orthogonal to the first direction.

4. The MCM of claim 1, wherein:
    the side-wall structure extends around the electrical device to form an enclosure between the top surface of the substrate and the shield lid; and
    the shield lid further comprises openings through which a molding compound may be disposed in the enclosure.

5. The MCM of claim 1, wherein:
    the side-wall structure extends around the electrical device to form an enclosure between the top surface of the substrate and the shield lid; and
    the enclosure forms an air space around the electrical device.

6. The MCM of claim 5, wherein the conductive layer of the shield lid comprises a first conductive layer and the shield lid further comprises a second conductive layer under the first conductive layer and having a higher conductivity than the first conductive layer.

7. The MCM of claim 5, wherein:
    the conductive layer of the shield lid is a first conductive layer;
    the shield lid further comprises a heat sink layer over the electrical device; and
    the MCM further comprises a substance other than air and a molding compound to thermally couple the electrical device to the heat sink layer.

8. The MCM of claim 1, wherein the conductive layer of the shield lid is a metal passivation layer disposed on a top surface of the MCM.

9. The MCM of claim 1, wherein:
    the conductive layer of the shield lid is a first conductive layer;
    the shield lid further comprises a substrate comprising at least a second conductive layer and an insulating material; and
    the vertical conductor configured to electrically couple the shield lid is electrically coupled to the second conductive layer.

10. The MCM of claim 9, further comprising a second electrical device disposed on a surface of the shield lid in an enclosure formed by the EMI shield.

11. The MCM of claim 9, further comprising a second electrical device disposed on a surface of the shield lid in an enclosure formed by the EMI shield.

12. The MCM of claim 1, wherein:
    the wall medium of the side-wall structure further comprises an insulating material; and
    the side-wall structure further comprises one of an inductor and a conductor trace used for routing enclosed within the insulating material and is configured to be electrically coupled to an electrical component in the MCM.

13. The MCM of claim 1, further comprising a second electrical device and a second side-wall structure disposed adjacent to the second electrical device.

14. The MCM of claim 1, wherein:
    the substrate further comprises:
        a bottom surface opposite to the top surface; and
        bottom contacts on the bottom surface configured to couple the MCM to an external circuit; and
    the MCM further comprises a wall structure disposed on the bottom surface of the substrate, the wall structure comprising:
        a second wall medium; and
        a vertical conductor disposed at least one of on and inside the second wall medium, the vertical conductor electrically coupled to the bottom contacts.

15. The MCM of claim 14, further comprising a second electrical device mounted on the bottom surface of the substrate.

16. The MCM of claim 1, integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet;
    a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

17. A method of fabricating a multi-component module (MCM), the method comprising:
disposing a shield structure adjacent to a top surface of a substrate and adjacent to an electrical device on the top surface of the substrate, the shield structure comprising a side-wall structure comprising:
a wall medium; and
a vertical conductor disposed at least one of on and inside the wall medium, a bottom end portion of the vertical conductor configured to electrically couple to a ground layer in the substrate;
disposing a molding compound on the top surface of the substrate; and
disposing a conductive layer on a top surface of the MCM, the conductive layer electrically coupled to a top end portion of the vertical conductor to form at least a portion of a shield lid of an electromagnetic interference (EMI) shield;
fabricating the side-wall structure, comprising:
disposing a bottom conductive layer corresponding to a shape of the side-wall structure on a bottom surface of an unshaped wall medium;
shaping the unshaped wall medium to form the side-wall structure according to a shape of the bottom conductive layer;
disposing the vertical conductor at least one of on and inside the wall medium extending in a height direction, orthogonal to a length direction and a width direction, between the bottom conductive layer on a bottom surface of the wall medium and a top surface of the wall medium, electrically coupling the vertical conductor to the bottom conductive layer;
forming a hole in the wall medium in the height direction of the wall medium; and
disposing the vertical conductor on the wall medium further comprises disposing a conductive material on a side surface of the hole in the wall medium to form a semi-cylindrical conductor.

18. The method of claim 17, wherein disposing the shield structure adjacent to the electrical device further comprises placing the side-wall structure on the top surface of the substrate such that the bottom conductive layer on the wall medium is disposed on a contact electrically coupled to the ground layer.

19. The method of claim 17, further comprising reducing a thickness of the molding compound above the top surface of the substrate to form a planar surface including a top surface of the side-wall structure.

20. The method of claim 19, wherein disposing the molding compound on the top surface of the substrate further comprises disposing the molding compound by compression molding or transfer molding.

21. The method of claim 17, further comprising disposing a wall structure on a bottom surface of the substrate opposite to the top surface, the wall structure comprising:
a second wall medium; and
a second vertical conductor disposed at least one of on and inside the second wall medium, the second vertical conductor coupled to a contact on the bottom surface of the substrate and configured to couple the MCM to an external circuit.

22. The method of claim 21, further comprising disposing a second electronic device on the bottom surface of the substrate.

23. A method of fabricating a multi-component module (MCM), the method comprising:
disposing a shield structure adjacent to a top surface of a substrate and adjacent to an electrical device on the top surface of the substrate, the shield structure comprising a side-wall structure comprising:
a wall medium; and
a vertical conductor disposed at least one of on and inside the wall medium, a bottom end portion of the vertical conductor configured to electrically couple to a ground layer in the substrate;
disposing a molding compound on the top surface of the substrate; and
disposing a conductive layer on a top surface of the MCM, the conductive layer electrically coupled to a top end portion of the vertical conductor to form at least a portion of a shield lid of an electromagnetic interference (EMI) shield;
fabricating the side-wall structure, comprising:
disposing a bottom conductive layer corresponding to a shape of the side-wall structure on a bottom surface of an unshaped wall medium;
shaping the unshaped wall medium to form the side-wall structure according to a shape of the bottom conductive layer; and
disposing the vertical conductor at least one of on and inside the wall medium extending in a height direction, orthogonal to a length direction and a width direction, between the bottom conductive layer on a bottom surface of the wall medium and a top surface of the wall medium, electrically coupling the vertical conductor to the bottom conductive layer;
disposing the shield structure of the EMI shield further comprises forming a shield carrier and coupling the top surface of the wall medium to the shield carrier; and
shaping the unshaped wall medium further comprises decoupling, from the shield carrier, portions of the unshaped wall medium on which the bottom conductive layer is not disposed.

24. The method of claim 23, wherein disposing the shield structure adjacent to the top surface of the substrate and adjacent to the electrical device further comprises disposing the shield structure including the side-wall structure coupled to the shield carrier on the top surface of the substrate.

25. The method of claim 24, further comprising disposing the molding compound on the top surface of the substrate through openings in the shield carrier.

26. The method of claim 25, further comprising disposing the molding compound on the top surface of the substrate through openings in the side-wall structure.

27. The method of claim 23, further comprising thinning a thickness of the shield carrier in a direction orthogonal to the top surface of the substrate.

28. The method of claim 27, wherein thinning the shield carrier in the direction orthogonal to the top surface of the substrate further comprises completely removing the shield carrier.

29. The method of claim 27, wherein:
the shield carrier comprises a thermally conductive layer having a first thickness and including a thicker section having a second thickness greater than the first thickness disposed over the electrical device; and
thinning the shield carrier comprises thinning the shield carrier by at least the first thickness and leaving a portion of the shield carrier comprising the thicker section disposed over the electrical device to provide a heat sink for the electrical device.

30. The method of claim 27, wherein:
the shield carrier comprises a substrate coupled to a heat sink disposed over the electrical device; and
thinning the shield carrier comprises removing the substrate and leaving at least a portion of the heat sink disposed over the electrical device.

31. The method of claim 23, wherein the shield carrier comprises at least a portion of the shield lid on the top surface of the MCM.

32. The method of claim 31, further comprising disposing the molding compound on the top surface of the substrate wherein an enclosure formed over the electrical device by the EMI shield prevents disposing the molding compound within the enclosure.

33. The method of claim 31, wherein:
fabricating the MCM further comprises laser engraving the shield lid to a maximum depth corresponding to a laser stop layer on a bottom surface of the shield carrier.

34. The method of claim 31, wherein:
disposing the shield structure adjacent to the electrical device further comprises disposing an upper substrate comprising at least one conductive layer and an insulating material over the electrical device; and
electrically coupling the shield lid to the top end portion of the vertical conductor in the side-wall structure further comprises electrically coupling the top end portion of the vertical conductor to a contact on a surface of the upper substrate.

35. The method of claim 23, further comprising disposing a thermal material on the electrical device to thermally couple the electrical device to the shield carrier.

36. A multi-component module (MCM), comprising:
an electrical device mounted on a top surface of a substrate comprising a ground layer; and
an electromagnetic interference (EMI) shield disposed adjacent to the top surface of the substrate and proximate to the electrical device, the EMI shield comprising:
a shield lid adjacent to a first side of the electrical device; and
a side-wall structure disposed adjacent to at least a second side of the electrical device, the side-wall structure comprising:
a wall medium; and
a vertical conductor disposed at least one of on and inside the wall medium and configured to electrically couple the shield lid to the ground layer of the substrate,
wherein:
the shield lid comprises a conductive layer extending parallel to the top surface of the substrate, adjacent to the electrical device and the side-wall structure;
the side-wall structure extends in a direction orthogonal to the top surface of the substrate between the top surface of the substrate and the shield lid;
the side-wall structure extends around the electrical device to form an enclosure between the top surface of the substrate and the shield lid; and
the enclosure forms an air space around the electrical device.

37. The MCM of claim 36, wherein the conductive layer of the shield lid comprises a first conductive layer and the shield lid further comprises a second conductive layer under the first conductive layer and having a higher conductivity than the first conductive layer.

38. The MCM of claim 36, wherein:
the conductive layer of the shield lid is a first conductive layer;
the shield lid further comprises a heat sink layer over the electrical device; and
the MCM further comprises a substance other than air and a molding compound to thermally couple the electrical device to the heat sink layer.

39. A multi-component module (MCM), comprising:
an electrical device mounted on a top surface of a substrate comprising a ground layer; and
an electromagnetic interference (EMI) shield disposed adjacent to the top surface of the substrate and proximate to the electrical device, the EMI shield comprising:
a shield lid adjacent to a first side of the electrical device; and
a side-wall structure disposed adjacent to at least a second side of the electrical device, the side-wall structure comprising:
a wall medium; and
a vertical conductor disposed at least one of on and inside the wall medium and configured to electrically couple the shield lid to the ground layer of the substrate,
wherein:
the shield lid comprises a conductive layer extending parallel to the top surface of the substrate, adjacent to the electrical device and the side-wall structure;
the side-wall structure extends in a direction orthogonal to the top surface of the substrate between the top surface of the substrate and the shield lid;
the conductive layer of the shield lid is a first conductive layer;
the shield lid further comprises a substrate comprising at least a second conductive layer and an insulating material; and
the vertical conductor configured to electrically couple the shield lid is electrically coupled to the second conductive layer.

* * * * *